(12) United States Patent
Dong et al.

(10) Patent No.: US 8,143,890 B2
(45) Date of Patent: Mar. 27, 2012

(54) SPECTRAL RESOLUTION ENHANCEMENT OF MAGNETIC RESONANCE SPECTROSCOPIC IMAGING

(75) Inventors: Zhengchao Dong, New York, NY (US); Bradley Scott Peterson, Somers, NY (US)

(73) Assignee: Trustees of Columbia University in the City of New York, New York, NY (US)

( * ) Notice: Subject to any disclaimer, the term of this patent is extended or adjusted under 35 U.S.C. 154(b) by 275 days.

(21) Appl. No.: 12/471,317

(22) Filed: May 22, 2009

(65) Prior Publication Data

US 2010/0085050 A1 Apr. 8, 2010

Related U.S. Application Data

(60) Provisional application No. 61/056,103, filed on May 27, 2008.

(51) Int. Cl.
*G01V 3/00* (2006.01)
(52) U.S. Cl. ...................................................... 324/309
(58) Field of Classification Search ........... 324/300–322
See application file for complete search history.

(56) References Cited

U.S. PATENT DOCUMENTS 5,285,157 A * 2/1994 Zur ................................ 324/309

OTHER PUBLICATIONS

Maudsley, A., Spectral Lineshape Determination by Self-Deconvolution, journal, Journal of Magnetic Resonance, Mar. 28, 1994, pp. 47-57, Academic Press, Inc., United States.
Metz, K. et al., Reference Deconvolution: A Simple and Effective Method for Resolution Enhancement in Nuclear Magnetic Resonance Spectroscopy, journal, Aug. 26, 1999, pp. 21-42, John Wily & Sons, Inc., United States.
Morris, G., Compensation of Instrumental Imperfections by Deconvolution Using an Internal Reference Signal, journal, Journal of Magnetic Resonance, Jul. 21, 1988, pp. 547-552, Academic Press, Inc., United States.
Soher, B. et al., Evaluation of Variable Line-Shape Models and Prior Information in Automated A1H Spectroscopic Imaging Analysis, journal, Jul. 18, 2004, pp. 1246-1254, Wiley-Liss, Inc., United States.
Spielman, D. et al., Water Referencing for Spectroscopic Imaging, journal, Jan. 6, 1989, pp. 38-49, Academic Press, Inc., United States.
Webb, P. et al., Inhomogeneity Correction for in Vivo Spectroscopy by High-Resolution Water Referencing, journal, Feb. 1, 1991, pp. 1-11, Academic Press, Inc., United States.
Willcott, M. et al., Magnetic Field Mapping in NMR Imaging, journal, Apr. 27, 1987, pp. 301-306, vol. 5, Pergamon Journals Ltd., United States.

* cited by examiner

*Primary Examiner* — Dixomara Vargas
(74) *Attorney, Agent, or Firm* — Evans & Molinelli PLLC; Eugene Molinelli

(57) ABSTRACT

A method and apparatus for enhancing the spectral resolution of magnetic resonance spectroscopic (MRS) measurements include receiving time domain echo data from an MRS measurement for an MRS volume in a subject. Also received are high spatial resolution complex signal values within the MRS volume based on magnetic resonance imaging (MRI) measurements. Frequency-domain content is determined for the echo data based at least in part on the complex signal values. For example, in some embodiments, receiving complex signal values includes receiving high spatial resolution complex signal values within the MRS volume for each of two different echo time settings. The frequency-domain content of the echo data is corrected for a lineshape profile based on high resolution frequency dispersion values for the MRS volume determined from differences in the complex signal values for the two different echo time settings.

17 Claims, 17 Drawing Sheets

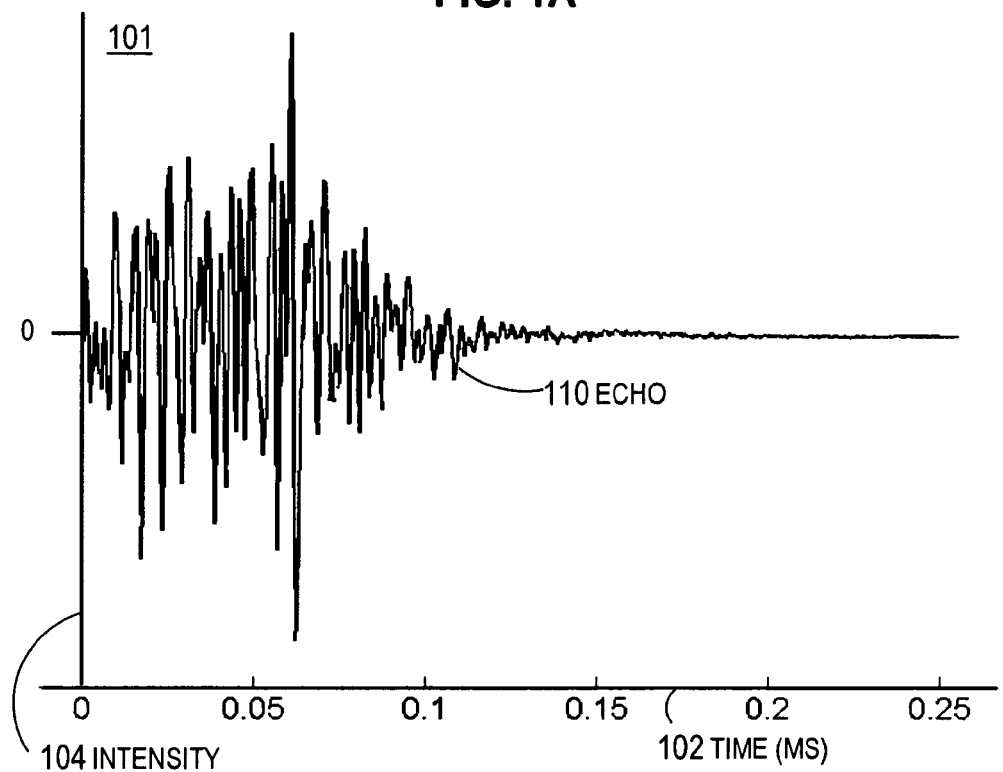
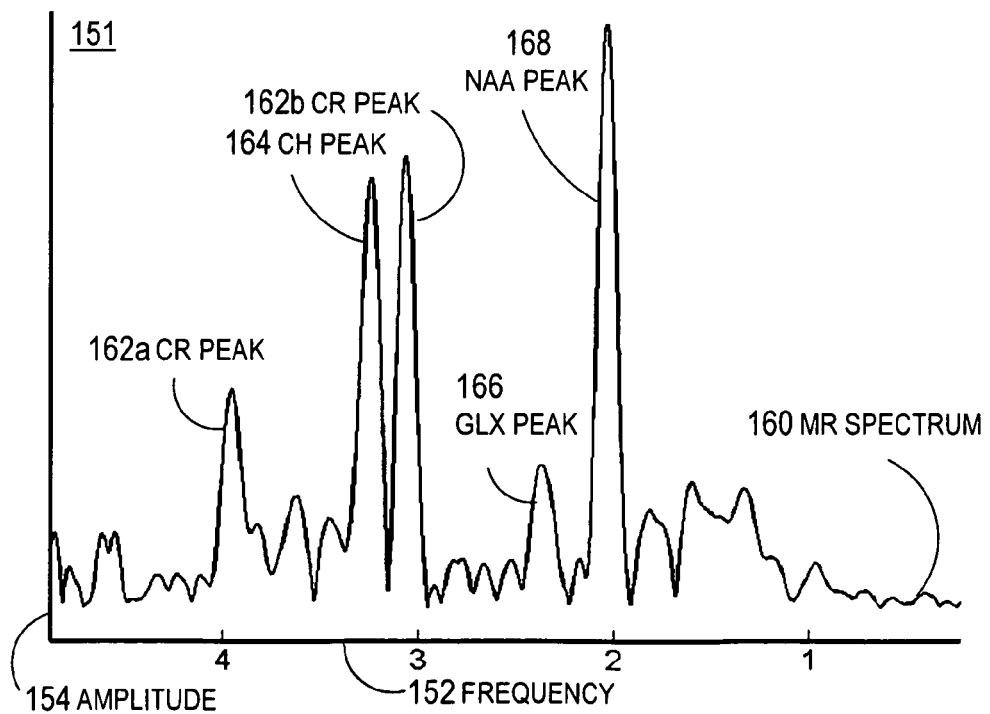

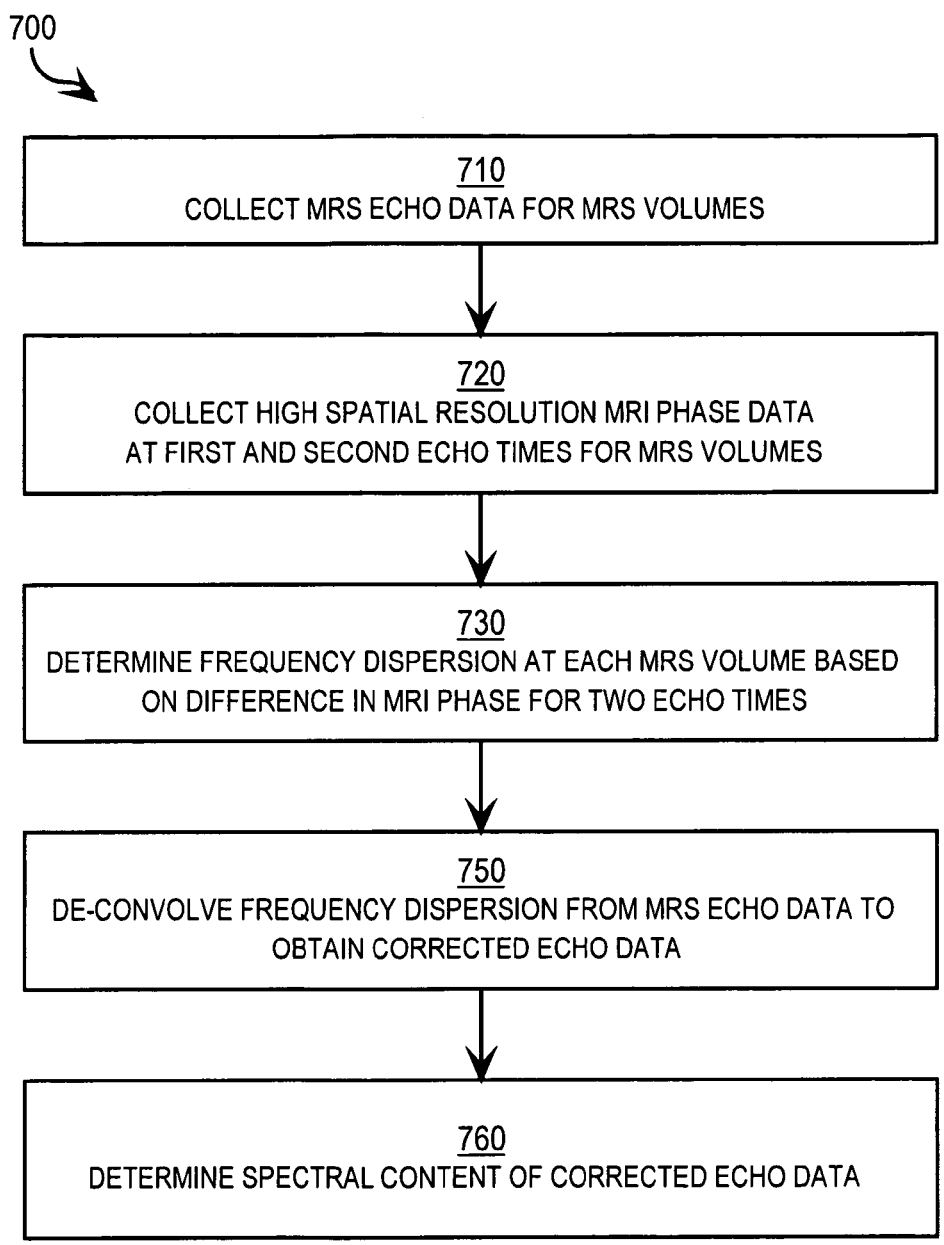

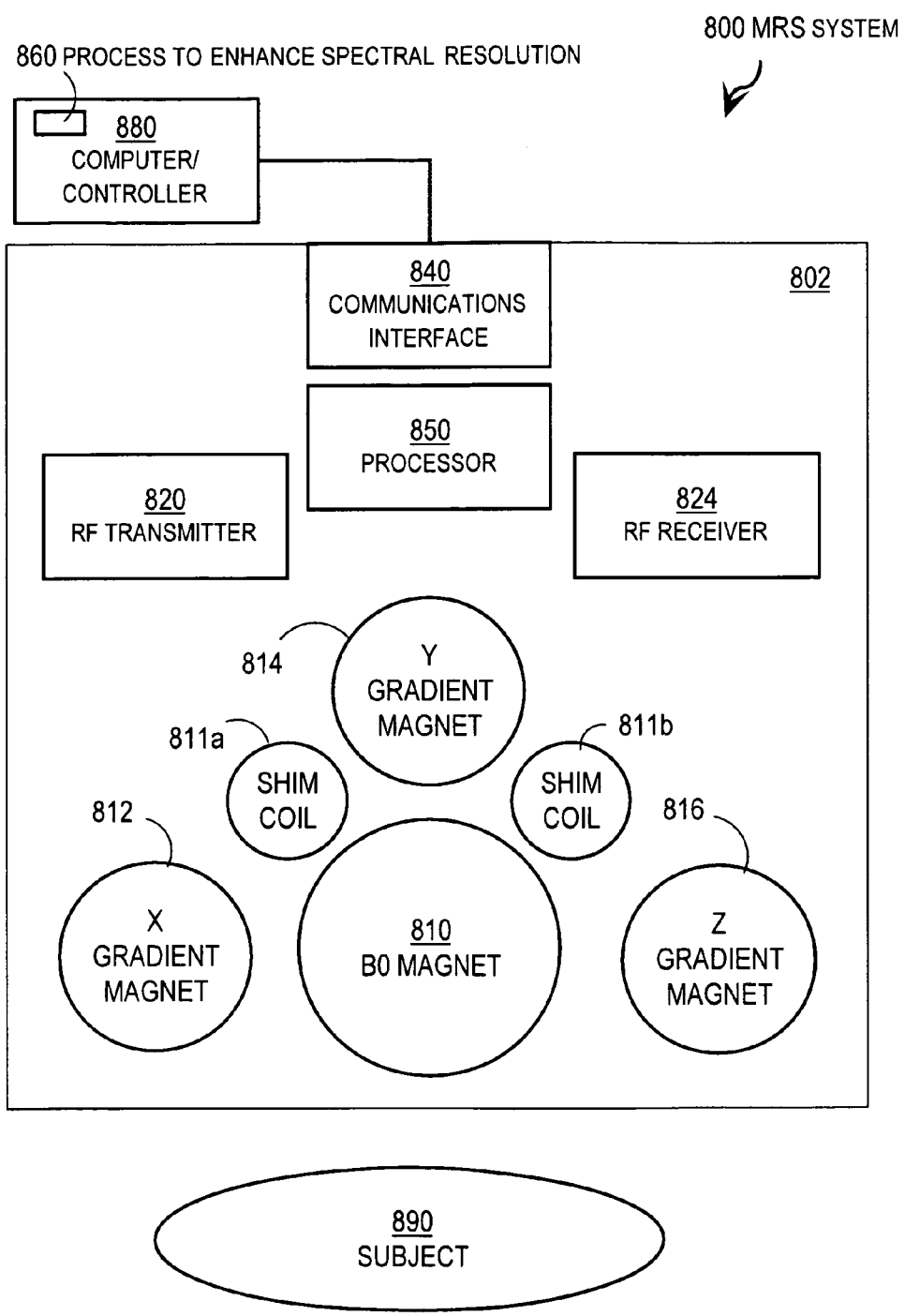

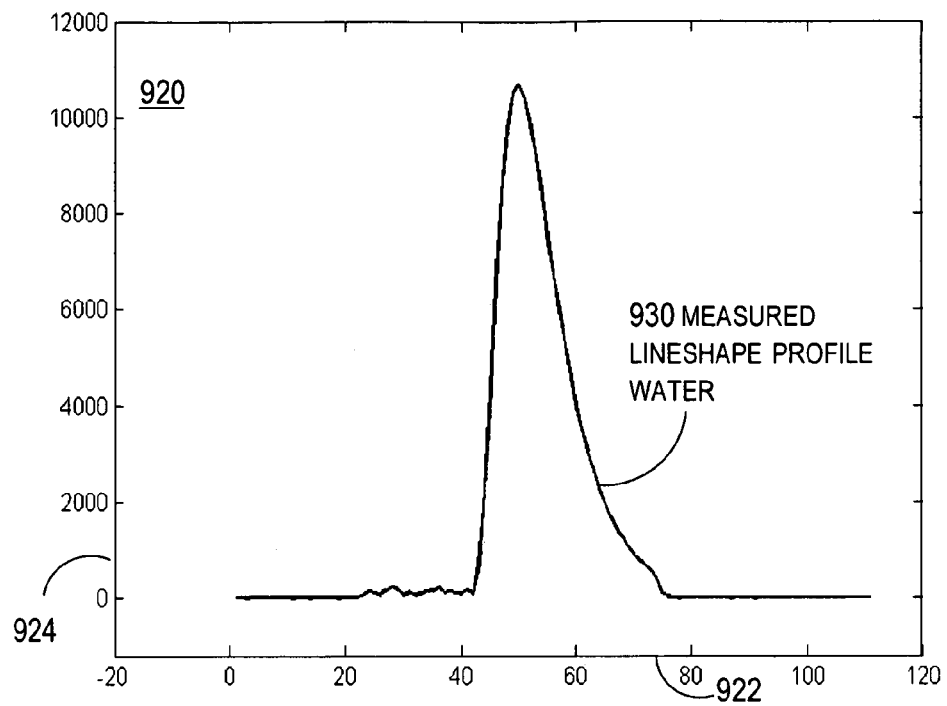
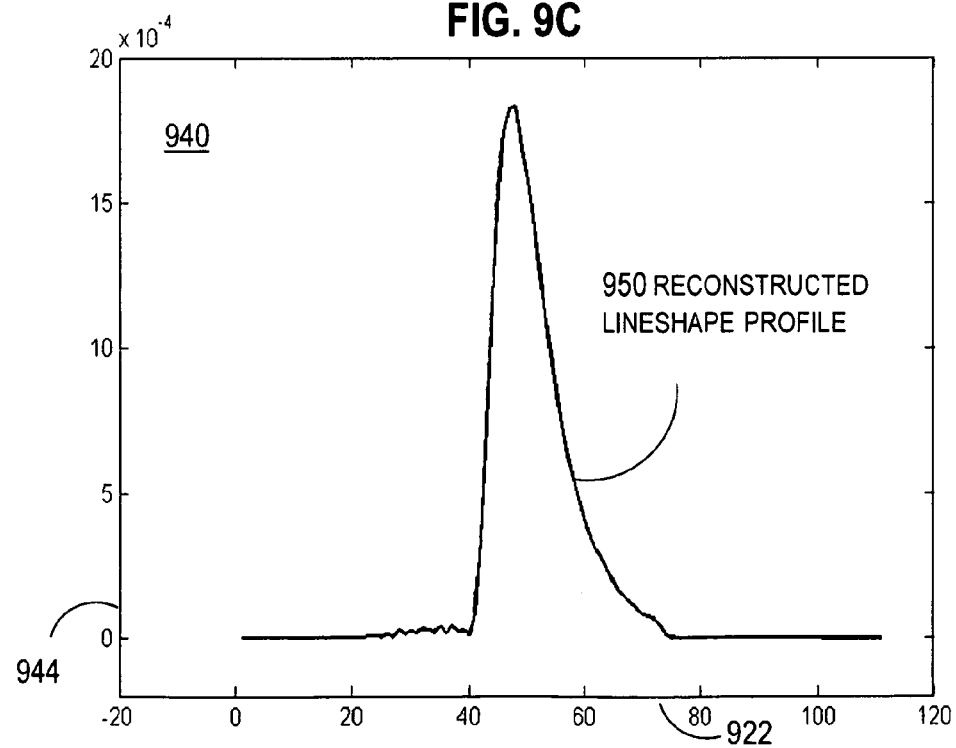

SPECTRAL RESOLUTION ENHANCEMENT OF MAGNETIC RESONANCE SPECTROSCOPIC IMAGING

CROSS-REFERENCE TO RELATED APPLICATIONS

This application claims benefit of Provisional Appln. 61/056,103, filed May 27, 2008 under 35 U.S.C. §119(e).

STATEMENT OF GOVERNMENTAL INTEREST

This invention was made with partial government support for Zhengchao Dong by the New York State Psychiatric Institute (NYSPI). The government has certain rights in the invention.

BACKGROUND OF THE INVENTION

1. Field of the Invention

The present invention relates to magnetic resonance spectroscopy (MRS), and in particular to enhancing spectral resolution of MRS and MRS imaging (MRSI) by de-convolving the effects of spatial variations in the base magnetic field ($B_0$) determined from magnetic resonance imaging (MRI). In the following, the base magnetic field or static magnetic field may represent the combination of the external magnetic field and the macroscopic effects of the tissue susceptibility.

2. Description of the Related Art

Nuclear magnetic resonance (NMR) studies magnetic nuclei by aligning them with an applied constant magnetic field ($B_0$) and perturbing this alignment using an alternating magnetic field ($B_1$), orthogonal to the constant magnetic field. The resulting response to the perturbing magnetic field is the phenomenon that is exploited in magnetic resonance spectroscopy (MRS) and magnetic resonance imaging (MRI).

The elementary particles, neutrons and protons, composing an atomic nucleus, have the intrinsic quantum mechanical property of spin. The overall spin of the nucleus is determined by the spin quantum number I. If the number of both the protons and neutrons in a given isotope are even, then I=0. In other cases, however, the overall spin is non-zero. A non-zero spin is associated with a non-zero magnetic moment, μ, as given by Equation 1a.

$$\mu = \gamma I \tag{1a}$$

where the proportionality constant, γ, is the gyromagnetic ratio. It is this magnetic moment that is exploited in NMR. For example, nuclei that have a spin of one-half, like Hydrogen nuclei ($^1H$), a single proton, have two possible spin states (also referred to as up and down, respectively). The energies of these states are the same. Hence the populations of the two states (i.e. number of atoms in the two states) will be approximately equal at thermal equilibrium. If a nucleus is placed in a magnetic field, however, the interaction between the nuclear magnetic moment and the external magnetic field means the two states no longer have the same energy. The energy difference between the two states is given by Equation 1b.

$$\Delta E = \hbar \gamma B_0 \tag{1b}$$

where $\hbar$ is Plank's reduced constant. Resonant absorption will occur when electromagnetic radiation of the correct frequency to match this energy difference is applied. The energy of photons of electromagnetic radiation is given by Equation 2.

$$E = hf \tag{2}$$

where f is the frequency of the electromagnetic radiation and $h = 2\pi\hbar$. Thus, absorption will occur when the frequency is given by Equation 3.

$$f = \gamma B_0/(2\pi) \tag{3}$$

The NMR frequency f is shifted by the 'shielding' effect of the surrounding electrons. In general, this electronic shielding reduces the magnetic field at the nucleus (which is what determines the NMR frequency). As a result, the energy gap is reduced, and the frequency required to achieve resonance is also reduced. This shift of the NMR frequency due to the chemical environment is called the chemical shift, and it explains why NMR is a direct probe of chemical structure.

Applying a short electromagnetic pulse in the radio frequency range to a set of nuclear spins simultaneously excites all the NMR transitions. In terms of the net magnetization vector, this corresponds to tilting the magnetization vector away from its equilibrium position (aligned along the external magnetic field, $B_0$). The out-of-equilibrium magnetization vector precesses about the external magnetic field at the NMR frequency of the spins. This oscillating magnetization induces a current in a nearby pickup coil acting as a radio frequency (RF) receiver, creating an electrical signal oscillating at the NMR frequency. A portion of this time domain signal (intensity vs. time) is known as the free induction decay (FID) and contains the sum of the NMR responses from all the excited spins. In order to obtain the frequency-domain NMR spectrum (intensity vs. frequency) for magnetic resonance spectroscopy (MRS) and MRS imaging (MRSI), this time-domain signal is Fourier transformed.

Spectral resolution refers to the ability to distinguish two closely spaced peaks in any spectrum. It is one of the important criteria that define the quality of MRS and MRSI. Low spectral resolution can obscure the information available from molecules of interest, such as metabolites, in a volume of tissue, thus making difficult or impossible the detection and quantification of some or all of those metabolites.

Reduced spectral resolution is a special problem for in vivo proton MRS ($^1H$ MRS) of the brain, for several reasons. First, the chemical shift differences of different brain metabolites are relatively small (i.e, the spectral peaks are inherently very close to each other), and the line splitting caused by J-coupling further reduces the separation of the peaks in the spectrum. J-coupling (also called indirect dipole-dipole coupling) is the coupling between two nuclear spins due to the influence of bonding electrons on the magnetic field running between the two nuclei. Consequently, spectral lines of some molecules intrinsically overlap and might not be distinguished. Second, magnetic field inhomogeneity caused by the spatial variation of the static external field $B_0$ and by local susceptibility differences of different tissues may produce linebroadening and distortion of lineshape, and thereby, reduce spectral resolution. As a result, some lines that are intrinsically separated may overlap in standard MSR measurements and can not be resolved within the portion of the spectrum associated with the metabolites. Third, motion of the person being imaged may produce linebroadening and reduce spectral resolution.

Many techniques have been developed to improve the spectral resolution of in vivo MRS. These techniques can be classified into two categories representing either acquisition or processing of the spectral data.

Within the category of data acquisition, the most commonly employed strategy for improving spectral resolution is the automated techniques for improving the homogeneity of the magnetic field $B_0$. Fast and high order shimming techniques have been implemented on modern scanners to make $B_0$ more uniform across a subject being scanned, yet these methods cannot eliminate all variation in local magnetic fields that are caused by the differing magnetic susceptibilities of various interposed tissues within the body. To image at higher magnetic field strengths is another strategy to increase spectral resolution, as well as the signal-to-noise ratio (SNR) of the MRS. Theoretically, doubling the field strength should double the differences in chemical shifts and the separations peaks in the metabolic spectrum. Unfortunately, the observed benefit of higher field strengths in improving spectral resolution is much lower than theoretically predicted. For example, spectral resolution at 3 Tesla (T, 1 T=1 Newton per Ampere per meter) only increases marginally compared with spectral resolution obtained at 1.5 T. Two reasons for this are that scanners with higher field strengths come with greater inhomogeneity of their magnetic fields, and the higher fields shorten the $T_2$ relaxation times of metabolites, both of which increase linewidths of the spectrum. The $T_2$ relaxation time is the time for precessing nuclei to fall out of alignment with each other (returning the net magnetization vector to a non-precessing field) and thus stop producing a signal. In addition, the upper limit on field strength is constrained by practical and safety considerations. Techniques of fast acquisition of data can reduce the total scan time and thereby reduce the likelihood that the person being imaged moves, and this will indirectly reduce the linebroadening caused by subject motion. Other acquisition-based techniques that are designed to improve spectral resolution include higher spatial resolution MRSI and 2 dimensional (2D) J-resolved MRSI. However, both of these techniques usually require long scan times which cannot be afforded in many clinical and research applications.

Most processing methods to improve spectral resolution are either borrowed or modified from those commonly used in processing conventional Nuclear Magnetic Resonance (NMR), but these usually produce very limited improvements of spectral resolution for data acquired in vivo. The method of Positive Exponential Multiplication (PEM), for example, multiplies the free induction decay (FID, defined above) with a positive exponential function. Although this operation can increase the spectral resolution, it also increases noise in the signal and reduces its overall SNR. This is a price that usually cannot be afforded with the in vivo data, because the SNR of in vivo MRS is typically already very low. A method similar to PEM is the double exponential multiplication (DEM), which transforms the Lorentzian lineshape to a Gaussian lineshape, which has a narrower linewidth at the bottom of a peak than the former does. With carefully selected exponential factors, DEM can improve spectral resolution while largely preserving the SNR. Because the lineshape of in vivo MRS is more Gaussian than Lorentzian, however, DEM has limited applicability for in vivo MRSI. Another processing-based method is the spectral de-convolution using the isolated singlet of water as a reference. An assumption of this approach is that the water peak and metabolic peaks have an identical lineshape, which is not always true for in vivo MRSI due at least to two reasons: 1] the differences in distribution profiles; and 2] the chemical shift artifacts. Moreover, acquiring an MRSI for water doubles the total MRSI scan time (about 30 minutes per scan), which cannot be afforded in many clinical and research applications. Because of these inherent difficulties, the existing processing-based methods have limited applicability for improving spectral resolution in MRSI in vivo.

SUMMARY OF THE INVENTION

Techniques are provided for enhancing the spectral resolution of magnetic resonance spectroscopy (MRS).

In one set of embodiments, a method includes receiving time domain echo data from an MRS measurement for an MRS volume in a subject. Also received are high spatial resolution complex signal values within the MRS volume based on magnetic resonance imaging (MRI) measurements. Frequency-domain content is determined for the echo data based at least in part on the complex signal values.

In another set of embodiments, a method includes collecting time domain echo data (such as FID data) for an MRS volume in a subject using an MRS system. Also collected are high spatial resolution complex signal values in the MRS volume using a magnetic resonance imaging (MRI) mode of the MRS system. Frequency-domain content of the echo data is determined based at least in part on the complex signal values.

In other embodiments, an apparatus or a computer-readable medium is configured to perform one or more steps of the above methods.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A is a graph that illustrates an example time domain echo from an MRS system for an MRS volume in a subject;

FIG. 1B is a graph that illustrates an example frequency-domain content (spectrum) of a time domain echo from an MRS system for an MRS volume in a subject;

FIG. 7 is a flow diagram that illustrates an example method for determining high spectral resolution frequency-domain content of echo data, according to an embodiment;

FIG. 8 is a block diagram that illustrates an example MRS system, according to an embodiment;

FIG. 9B is a graph that illustrates an example MRS measurement of the spectrum of water in an MRSI voxel of the phantom;

FIG. 9C is a graph that illustrates an example reconstructed lineshape profile for the MRS voxel based on integrating the lineshape profiles of the MRI voxels in the MRSI voxel, according to an embodiment;

DETAILED DESCRIPTION

Figure 2:
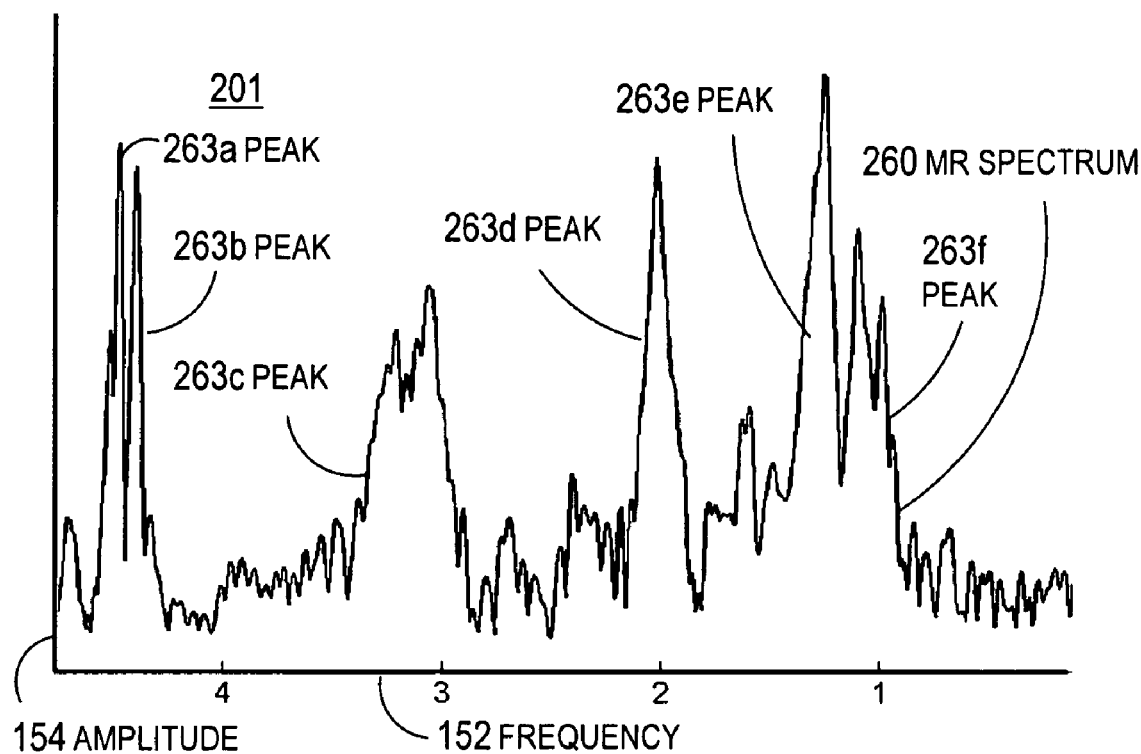
FIG. 2 is a graph that illustrates an example non-ideal spectrum using an MRS system.

A method and apparatus are described for enhancing the spectral resolution of magnetic resonance spectroscopy (MRS) and, consequently magnetic resonance spectroscopic imaging (MRSI). In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Some embodiments of the invention are descried below in the context of detecting brain metabolites in magnetic resonance spectroscopic imaging (MRSI). However, the invention is not limited to this context. In other embodiments one or more other constituents in a magnetic resonance spectroscopy (MRS) volume are determined for imaging or non imaging operations on human or non-human or inanimate subjects, in vivo or not.

1. Overview of MRS

FIG. 1A is a graph 101 that illustrates an example time domain echo 110 from an MRS system for an MRS volume in a human subject. The horizontal axis 102 is time in milliseconds (ms, 1 ms=$10^{-3}$ seconds). The vertical axis 104 is measured signal intensity (e.g., current in RF receiver antenna) in arbitrary units. The second portion of echo 110 is known as the free induction decay (FID) and contains the sum of the NMR responses from all the excited spins resulting from a short duration transmitted RF pulse.

FIG. 1B is a graph 151 that illustrates an example frequency-domain content (spectrum) of a time domain echo from an MRS system for an MRS volume in a subject. The horizontal axis 152 is frequency f in parts per million (ppm). Frequency in ppm is normalized as defined by $10^6(f-f_r)/f_0$, where $f_r$ is a reference frequency, and $f_0$ is the expected system frequency determined by $B_0$. The vertical axis 154 is spectral amplitude in arbitrary units. Plotted in graph 151 is an MR spectrum 160 obtained by performing a Fourier transform on the echo 110 in FIG. 1A. This spectrum 160 shows isolated peaks for several brain metabolites useful in diagnosing brain function, including Creatine peaks 162a and 162b, Choline peak 164, Glutamine and Glutamate (Glx) peak 166, and N-acetyl aspartate (NAA) peak 168.

FIG. 2 is a graph 201 that illustrates an example non-ideal spectrum using an MRS system with inhomogeneities in the applied, static magnetic field $B_0$. The horizontal axis 152 and vertical axis 154 are as described above for FIG. 1B. The non-ideal spectrum 260 includes peak 263a, peak 263b, peak 263c, peak 263d, peak 263e and peak 263f (collectively called hereinafter peaks 263). Creatine peak 162a and Glx peak 166 from the spectrum 160 are not properly depicted; the peak 263c is at best ambiguous evidence of Choline peak 163 or Creatine peak 162b from the spectrum 160, or both; and peak 263d is both shorter and broader and more distorted than the NAA peak 168 in the spectrum 160. There is clear lineshape distortion of the NAA peak 263d because the lineshape profile is not smooth, symmetric and regular, and can not be described by analytical equations, such as Gaussian function. For quantitative assessment of relative or absolute brain metabolite concentration, higher spectral resolution than that displayed in spectrum 260 is desirable.

The inventors have discovered that desirable improvement in resolution of MR spectra can be obtained more efficiently than extant approaches. These techniques significantly enhance the spectral resolution of MRS and MRSI by correcting local field in-homogeneities caused both by the main field $B_0$ and susceptibility differences of the tissues. A second, time-consuming water MRSI scan is not required. Certain embodiments are validated and demonstrated by phantom and in vivo experiments. The results show that these techniques can not only enhance the spectral resolution, and improve the lineshape but also increase the SNR of both MRS and MRSI.

2. Overview and Theory of Enhanced Spectral Resolution for MRS

At a given magnetic field strength, spectral resolution is related to linewidth of the spectrum, which is in turn determined jointly by the natural linewidth and linebroadening that is caused by inhomogeneity of the magnetic field. Microscopically, the linewidth of a metabolite spectrum from a particular MRS volume of a subject can be regarded as a combination of many spectral lines originating from tiny sub-volumes of the particular volume, each of these having their natural linewidths but with their differing frequencies altered slightly by the small strength differences of local field where the sub-volumes are located. Mathematically, this combination is described as a procedure of convolution of the natural linewidth and the profile of the lineshape. For in vivo MRSI, the profile of lineshape or the lineshape function is determined largely by the linebroadening caused by the field inhomogeneity in the static magnetic field, $B_0$.

The inventors have determined that the profile of the lineshape can be derived from the summation of the spectral lines with infinite linewidths. After de-convolving the measured spectra from the lineshape function that is derived from the measured field mapping, the inventors discovered that the linewidth is reduced significantly and thereby the spectral resolution of the in vivo MRS is enhanced. The inventors have designated some embodiments of this method as Spectral Resolution Amelioration by De-convolution (SPREAD). The field mapping can be generated with one or two MRI scans about three minutes each or less.

The following theoretical description is provided for purposes of more thoroughly explaining the disclosed embodiments. However, the invention is not limited by the completeness or accuracy of the following theoretical description.

A particular MRS volume is excited and all or part of the echo measured from that particular volume by using phase encoding (PE) magnetic gradient pulses with gradient magnitude G(t) and duration τ that impose spatial information on the MR signals of nuclei in the subject, as is well known in the art. The properties of the gradient pulses are expressed by a wavenumber k in the spatial-frequency (wavenumber) domain. A vector wavenumber $\vec{k}$ is defined by Equation 4a.

$$\vec{k} = \gamma \int_0^\tau \vec{G}(t) dt \qquad (4a)$$

Spatial information can be imposed with different spatial wavelengths $\vec{k}$ on nuclei at different spatial positions in the form of phase information, as in $2\pi \vec{k} \cdot \vec{r}$ (hence the term of phase encoding). Therefore, with appropriate $\vec{k}$ the MRS signals of nuclei from different parts of a volume being imaged can be spatially encoded or, in other words, the phase encoded MRS signal carries the spatial information of the nuclei that give the signals. The spatial information encoded in the MRS signal is exploited in the reconstruction of the MRS images. The resulting phase encoded measured signal is expressed as in Equation 4b.

$$S(t_d)_{\vec{k}_n} = \int_{-SW/2R}^{SW/2} \int \rho(\vec{r}, f) e^{j2\pi(\vec{k}_n \cdot \vec{r} + f t_d) + j2\pi \Delta f(\vec{r}) t_d} d\vec{r} df \qquad (4b)$$

$$= \int_{-SW/2R}^{SW/2} \int [\rho(\vec{r}, f) e^{j2\pi \Delta f(\vec{r}) t_d}] e^{j2\pi(\vec{k}_n \cdot \vec{r} + f t_d)} d\vec{r} df$$

In Equation 4b, $\rho(\vec{r},f)$ is the spin density in the subject at the location given by vector $\vec{r}$ with the frequency f, SW is the bandwidth of the RF receiver, j is the square root of −1, $\vec{k}_n$ is the wavenumber vector corresponding to a point in the wavenumber space (often called k-space) and representing a phase encoding (PE) step n, $\{t_d\}=t_1, t_2, t_D$ are the acquisition time points and Δf is the frequency dispersion caused by the field inhomogeneity ΔB. The frequency dispersion is related to the field by applying Equation 3, above, to yield Equation 5.

$$\Delta f(\vec{r}) = \gamma \Delta B(\vec{r})/2\pi \qquad (5)$$

For a proton, γ is the proton gyromagnetic ratio.

As described in more detail below, Δf can be derived from MRI measurements; and such derivation has been used to create images at MRI spatial resolution called field maps that indicate spatial variations in ΔB by virtue of Equation 5. MRI spatial resolution provides imaging volume elements (voxels) that are much smaller than a typical MRS voxel. For example, an MRSI voxel is approximately three orders of magnitude larger than a high resolution MRI voxel (e.g., an MRSI voxel is on the order of cubic centimeters, $cm^3$, and a MRI voxel is on the order of cubic millimeters, $mm^3$, where 1 mm=$10^{-3}$ meters and 1 cm=$10^{-2}$ meters).

In the case of conventional two spatial dimensions (2D) MRSI, as is well known, there are Nx phase encoding steps in the x direction and Ny phase encoding steps in the y direction, where x and y directions are perpendicular to each other and to the direction z. The static magnetic field $B_0$ is often in the z direction, but need not be. In this case, Equation 6a expresses the relationship between the wavenumber vectors.

$$\vec{k}_n = \vec{k}_{nx} + \vec{k}_{ny}, nx(ny)=1,2,\ldots,N_x(N_y) \qquad (6a)$$

This results in Nx*Ny phase encoded signals, which are represented by a three dimensional (3D) matrix in wavenumber space, with two spatial dimensions and one time domain spectral dimension as given by Equation 6b.

$$\{S(t_d)_{k_{nx},k_{ny}}\}_{N_x \times N_y \times D} \qquad (6b)$$

where D is the number of data points in the time domain spectral dimension. A two-dimensional spatial Fourier transform translates these wavenumber space signals into spatial signals for the Nx*Ny voxels in the MRS image. The signal in each MRS voxel is given by Equation 7.

$$s_V(t_d) = \int_{-SW/2V}^{SW/2} \int [\rho(\vec{r}, f) e^{j2\pi \Delta f(\vec{r}) t_d}] e^{j2\pi(\vec{k}_n \cdot \vec{r} + f t_d)} d\vec{r} df \qquad (7)$$

The integration in Equation 7 runs across the MRS voxel for simplicity of explanation. This simplification amounts to ignoring inter-voxel signal contamination caused by Gibbs's ringing or point spread function (PSF) effects caused by a limited number of phase encoding steps and second order effects of frequency dispersion from $B_0$ inhomogeneity.

It is further assumed, for purposes of explanation, that $\rho(\vec{r},f)$ is constant across the MRS voxel V. Equation 7 then can be written as expressed in Equation 8.

$$s_V(t_d) = s_V^0(t_d) \cdot \int_V e^{j2\pi \Delta f(\vec{r}) t_d} d\vec{r} \qquad (8)$$

where $s_V^0(t_d)$ is the time domain equivalent of $\rho(\vec{r},f)$, the ideal signal in a unity volume with intrinsic frequencies and linewidths. The phase terms in the integrand of Equation 8 induced by field inhomogeneity causes accelerated and distorted decay in the time domain signal $s_V(t_d)$ and, consequently, increased linewidth and distorted lineshape in the spectrum. We therefore refer to this term as lineshape profile of the voxel spectrum The ideal signal $s_V^0(t_d)$ can be recovered from the measured signal $s_V(t_d)$ by dividing the lineshape profile in a point-by-point manner as given in Equation 9.

$$s_V^0(t_d) = s_V(t_d) / \int_V e^{j2\pi \Delta f(\vec{r}) t_d} d\vec{r}. \qquad (9)$$

This is a procedure of de-convolution in the time domain. Thus, the ideal signal $s_V^0(t_d)$ is retrieved by de-convolving the measured echo from an MRS volume, $s_V(t_d)$, with the lineshape profile, provided $\Delta f(\vec{r})$ is known.

As mentioned above and described in more detail below, Δf is derived from MRI measurements on much smaller MRI voxels. Because the typical MRS voxel is approximately 3 orders of magnitude larger than a high resolution MRI voxel, in some embodiments, the integration in the denominator in Equation 9 is approximated by the summation of the integrand over all high resolution MRI voxels in the lower resolution MRS voxel. This approximation is expressed in Equation 10.

$$\int_V e^{j2\pi \Delta f(\vec{r}) t_d} d\vec{r} \approx \sum_{i=1}^{N} e^{j2\pi \Delta f(v_i) t_d} \quad (10)$$

where N is the number of high resolution MRI voxels in the MRS voxel.

In other embodiments, described in more detail below, the lineshape profile based on the MRI measurements is modified to better match the processing performed on the MRSI data and to account for PSF effects. Furthermore, in some embodiments, the lineshape profile is further modified to prevent spikes in the de-convolved spectrum where the lineshape profile crosses zero. In some embodiments, the lineshape profile is further modified to prevent noise amplification where the signal amplitude falls to values comparable to the noise level.

Equation 9 was derived under the assumption that the spin density $\rho(\vec{r},f)$ is constant within a voxel V, which is clearly not always true, especially in voxels consisting of multiple tissue types. In such circumstances, the lineshape is a function of both the field inhomogeneity and the concentrations of metabolites. However, field inhomogeneity is dominant and the effect of the spatial varying concentration within the voxel is small. Moreover, the two effects are independent and the final lineshape after de-convolution would be concentration weighted compared to the ideal lineshape. This approximation is often acceptable. In other embodiments, spin density variations within a voxel are estimated or assumed and accounted for in the lineshape profile determined and applied.

3. Method for Enhanced Spectral Resolution of MRS

FIG. 7 is a flow diagram that illustrates an example method 700 for determining high spectral resolution frequency-domain content of echo data, according to an embodiment. Although steps are depicted in FIG. 7 in a particular order for purposes of illustrating an embodiment, in other embodiments one or more steps are performed in a different order, or overlapping in time, in series or in parallel, or one or more steps are omitted or added, or steps are changed in some combination of ways. For example, in some embodiments, step 720 or both step 720 and step 730 precedes step 710.

In step 710, MRS time-domain echo data is collected from one or more MRS volumes in a subject. For example, free induction decay (FID) data is collected during step 710. Step 710 includes operating an MRS apparatus or system to deliver one or more phase encoded pulses and measure the phase encoded currents in a receiving antenna coil. This includes performing any shimming to make the static magnetic field $B_0$ as spatially uniform as possible. Step 710 also includes receiving the echo data at a data processing device, such as a general purpose computer. Any method may be used to perform step 710.

For example, in an illustrated embodiment, during step 710, MRS data was acquired using a whole-body 3 T scanner (Signa 3.0 T, GE Healthcare, Waukesha, Wis.) equipped with a single-channel volume coil for transmission and a standard quadrature head coil for receiving radiofrequency (RF) signals. Scout images in 3 orthogonal planes were first acquired for the localization of MRSI images. MRSI data were acquired using a multi-planar MRSI pulse sequence as described in Duyn J H, Gillen J, Sobering G, van Zijl P C, Moonen C T, "Multisection proton MR spectroscopic imaging of the brain," *Radiology* 1993, 188(1) pp 277-282. Image slices were placed in the axial plane and were angulated so as to parallel the anterior commissure-posterior commissure (AC-PC) line. The parameters used for data acquisition were as follows. Field of View (FOV) was set to 24×24 $cm^2$. Number of slices was set to 4. Nominal number of phase encoding (PE) steps in the x and y directions was set to 16×16 (data were sampled in an inscribed circle of diameter 16 in wavenumber space, resulting in an actual number of 180 PEs). Slice thickness was set to 10 mm, with spacing between slices set to 2 mm. The nominal MRS voxel size was therefore 2.25 $cm^3$. Repetition time (TR) was set to 2800 ms after an echo time (TE) of 144 ms. Spectral width of the RF receiver was 2000 Hz. An asymmetric echo with a long tail was acquired with 512 complex data points. Outer volume lipid signal was suppressed with user-placed saturation bands. Water suppression was realized by the CHESS pulses imbedded in the phase encoded sequence as described in Haase A, Frahm J, Hanicke W, Matthaei D., "$^1$H NMR chemical shift selective (CHESS) imaging," *Phys Med Biol* 1985, 30(4) pp 341-344.

In step 720, MRI complex signal data is collected from multiple high resolution MRI voxels within each MRS volume at two different echo times. Step 710 includes operating an MRS apparatus or system to deliver one or more phase encoded pulses and measure the phase encoded currents in a receiving antenna coil at the two echo times. This includes performing any shimming performed during step 710 to make the static magnetic field $B_0$ as spatially uniform as possible. Step 720 also includes receiving the complex signal data at a data processing device, such as a general purpose computer. Any method may be used to perform step 720. For example, in some embodiments, an MRI scan can be run with TE1 and then another MRI scan with TE2, at three to four minutes each. In some embodiments, a single MRI scan can be run with embedded TE1 acquisition and different TE2 acquisition.

In an illustrated embodiment, during step 720, immediately following step 710, high resolution MR images for field mapping were acquired using a commercial 3D MRI pulse sequence called Incoherent RF Spoiled Gradient Echo (SPGR). The slices of the 3D SPGR were parallel to the slices of the MRSI and the imaged volume of the 3D SPGR is slightly larger than that of the MRSI. The echo times of the two MR images were 8 and 10.5 ms, respectively. Other imaging parameters for the field mapping MRI sequence were as follows. The FOV was set to 24×24 $cm^2$. The slice thickness was set to 2 mm. The in-plane resolution was 256× 256, resulting in a nominal spatial resolution of 1.7 $mm^3$. TR was set to 13 ms. The flip angle was set to $11^{20}$. The RF receiver bandwidth, SW was 15.6 kHz. As a result, each MRSI slice covers 5 MRI slices and each MRS volume overlaps 1280 MRI voxels. To ensure identical field inhomogeneity during both the MRSI scan and MRI scan, only first order shimming was performed for MRSI, and the same shim values were kept for the MRI scans. All wavenumber space data for MRI were saved in complex form to facilitate generating the field maps. In addition, all MRI data were saved in the conventional magnitude form in the well-known DICOM format.

Step 720 follows step 710 in a preferred embodiment, because the shimming, PE encoding and other operational settings of the MRS measurement are already in place for the corresponding MRI measurements. In some embodiments, the shimming scan is done first; then the MRI scans are done without further shimming; then the MRSI scan is done without further shimming. In this way, both MRI and MRSI scans have the same shimming, and thus the same magnetic field inhomogeneity.

During step 730, frequency dispersion is computed for each MRS volume based on differences in MRI complex signal data for the two echo times, as described in more detail in the next section.

In step 750, the frequency dispersion is de-convolved from the MRS echo data to obtain corrected echo data. Step 750 includes determining a lineshape profile based on the frequency dispersion. In some embodiments, step 750 includes determining and applying modifications to match the wavenumber space processing in the MRS data processing, or suppressing spikes at zero crossing of the lineshape profile, or suppressing noise amplification, or performing other corrections, or some combination, as described in more detail in a later section.

In step 760, the frequency-domain content (e.g., the MRS spectrum) is computed for the corrected echo data. The resulting spectrum has enhanced spectral resolution.

These embodiments have several advantages over the long standing spectral de-convolution technique using internal water as a reference, as described in Macri M A, Garreffa G, Giove F, Guardati M, Ambrosini A, Colonnese C, Maraviglia B, "In vivo quantitative 1H MRS of cerebellum and evaluation of quantitation reproducibility by simulation of different levels of noise and spectral resolution," *Magn Reson Imaging* 2004, 22(10), pp 1385-139. The lineshape of unsuppressed water signal depends not only on spatial variation of the magnetic field $B_0$ but also on the distribution of water content of the brain. When more than one tissue types with differing water contents, such as gray matter and white matter in a human brain, especially cerebrospinal fluid, co-exist in significant quantities in an MRS voxel, the lineshape of water signal will deviate from the lineshape caused purely by field inhomogeneity. On the other hand, the illustrated embodiments eliminate lineshape distortion caused solely by field inhomogeneity. The $T_2$ relaxation time of tissue water is shorter than those of most metabolites and, therefore, the water signal decays more rapidly than metabolite signals in the time domain. Consequently, noise amplification and spike artifacts often occur at both ends of the resultant de-convolved signal, when water signal becomes smaller than the metabolite signals. Therefore, the gain in resolution improvement is often at the price of deteriorated SNR. On the other hand, $T_2$ relaxation time of the reconstructed lineshape signal is virtually infinite, and the lineshape signal decays slower than any metabolite signals. Therefore, the noise amplification and spike artifacts can largely be avoided. Internal water signal requires measuring the water MRSI in addition to the metabolite MRSI, which means double the total MRSI scan time. This is often unaffordable in many situations. Although the illustrated embodiments include MRI measurements for and computations of magnetic field maps, the time for measuring and determining these maps is about three minutes or less, only a small portion of the time for MRSI scan.

The illustrated embodiments, such as SPREAD, improve the spectral resolution by narrowing the linewidth and correcting lineshape distortion. These embodiments effectively increase the separations between spectral peaks, without increasing their absolute frequency differences, which is different from the strategies of imaging at higher magnetic field. Preliminary results showed that the SPREAD embodiment increased the spectral resolution by up to 50% and more in a phantom and up to 25% and more in human scans, which is higher than the increase of spectral resolution from 1.5 T to 3 T (see, for example, Dydak U, Schar M, "MR spectroscopy and spectroscopic imaging: comparing 3.0 T versus 1.5 T," *Neuroimaging Clin N Am,* 2006, 16(2) pp 269-283). A current comparison study on the SNR of proton MRS between 3 T and 7 T, shows that the SNR only improved marginally at 7 T against 3 T (Y Li et al., *Proc. Intl. Soc. Mag. Reson. Med.* 16 (2008), p 1592). This is likely because the increased linewidth at higher magnetic field strength can almost completely offset the increase in the chemical shifts. Another advantage of the SPREAD embodiment over the higher magnetic field strength strategy is that the SPREAD embodiment improves the lineshape of the spectrum and therefore allows improving the accuracy of the spectral fitting. Furthermore, the SPREAD embodiment avoids the adverse effects of higher magnetic field strengths, such as decreased SNR, increase chemical shift artifact, as well as increased RF field ($B_1$) inhomogeneity.

The performance of the illustrated embodiments for spectral resolution enhancement depends on the accurate field mapping and, thereby, the accurate reconstruction of the experimental lineshape. In general, the higher the resolution is, the more accurate the field mapping is. However, higher resolution may require longer measurement time, or result in lower SNR. The latter is detrimental for the accuracy of field mapping. In our pilot study, we found that the experimental lineshape reconstructed from ten 2D field maps of 1 mm thick was not superior to that reconstructed from 5 field maps of 2 mm thick, under the condition that the measurement time and the in-plane resolution of each slice was the same. This is likely because the benefit of higher spatial resolution was balanced by the disadvantage of lower SNR. 3D MRI sequence is preferable for high resolution field mapping in some embodiments, as it can generate MR images with much higher SNR than the 2D mode can.

3.1 Magnetic Field Mapping

During step 730, the frequency dispersion is determined in the course of performing magnetic field mapping as taught by Willcott M R, 3rd, Mee G L, Chesick J P., "Magnetic field mapping in NMR imaging," *Magn Reson Imaging,* 1987, 5(4) pp 301-306.

Figure 3A:
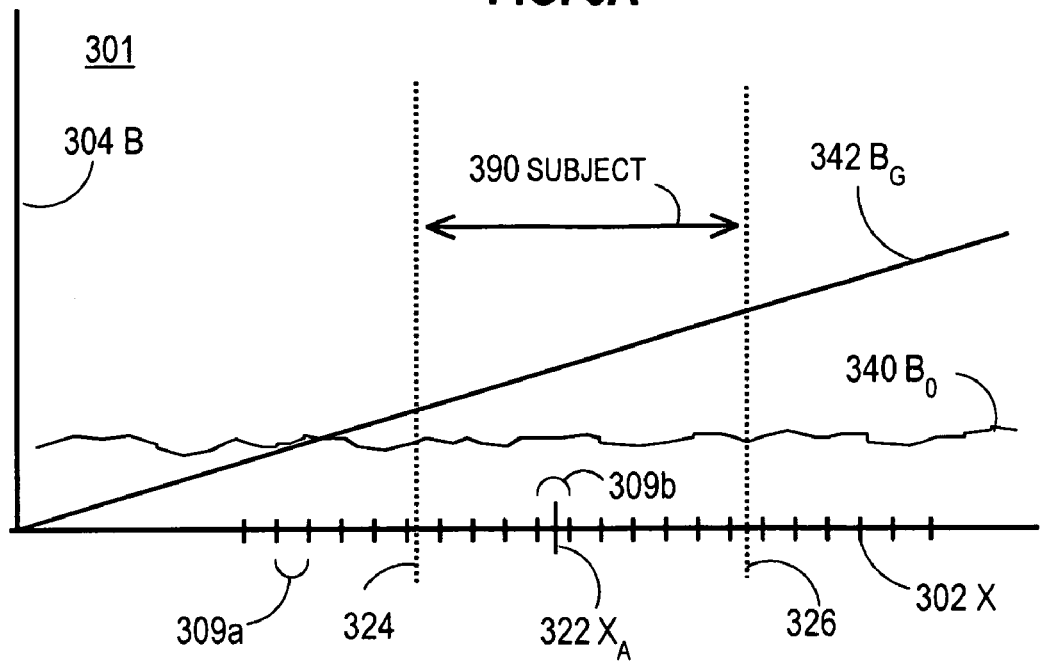
FIG. 3A is a graph that illustrates an example applied magnetic field B for a one dimensional high spatial resolution MRI measurement.

For purpose of illustrating how frequency dispersion is derived from MRI measurements at two different echo times, consider the following description. FIG. 3A is a graph 301 that illustrates an example applied magnetic field B for a one dimensional high spatial resolution MRI measurement. The horizontal axis 302 is distance in the x direction (e.g., in mm), perpendicular to the direction of the constant magnetic field $B_0$. The vertical axis 304 is magnetic flux density (e.g., in Tesla, T). The constant magnetic field in the z direction, $B_0$, is plotted as curve 340 and shows small variations as x varies. A change in the z direction magnetic field with changes in x position is called the gradient magnetic field G and is applied to distinguish different volumes within a subject for spatial encoding. The resulting magnetic field $B_G$ 342 from the gradient G is also plotted in the graph 301. The subject 390 occupies x positions between position 324 and position 326 on the x axis 302. A point $x_A$ 322 is depicted within the subject 390, and represents a high resolution MRI voxel location, with a width comparable to the width of the tick mark. MRSI uses electromagnetic wave returns from voxels that each represents a wider range of x values, so one dimensional low resolution voxels are depicted along the x axis, including voxel 309*a* and voxel 309*b*, collectively referenced hereinafter as MRSI voxels 309.

Along the x direction, the magnetic field is given by Equation 11.

$$B = B_0 + G^*x \tag{11}$$

The frequency $f_A$ of a proton with gyromagnetic ratio $\gamma$ at point $x_A$ is given by Equation 12.

$$f_A = \gamma B = \gamma (B_0 + G^*x_A) \tag{12}$$

In the presence of G, nuclei at different positions x have different resonant frequencies, and their signals (the so called wavenumber signal) can thus be spatially encoded. After data acquisition, a spatial Fourier Transform (FT) is used to decode the signal and recover the position of the signal within the subject.

At an initial time, t0, the protons in the field B are perturbed with a magnetic field in the y direction, perpendicular to x and z, and those perturbed protons precess about the z direction with a frequency equal to the magnetic resonance frequency f. If data is collected after a delay of TE1, then the protons have precessed by an angle associated with a phase $\beta 1$ that is related to the precession frequency. For example, at point $x_A$, $\beta 1$, in units of radians, is given by Equation 13a.

$$\beta 1(x_A) = 2\pi^* f_A {}^* TE1 = 2\pi^* \gamma B(x_A)^* TE1 \tag{13a}$$

The measured MRI signal at position $x_A$ is given by Equation 13b.

$$s1(x_A, TE1) = M0^* \exp(j^*\beta 1) = M0^* \exp(j^* 2\pi^* f_A {}^* TE1) \tag{13b}$$

where exp( ) is a function that raises the natural constant e to the power of the value inside the parentheses, j is the square root of −1, and s(x,t) is a complex number. The raw data from an MRI measurement with echo time=TE1 is a vector of complex number with phases of $\beta 1$ that vary with x. The phase is determined from these measurements of s1(x,t) by a function of the real and imaginary parts as measured by quadrature receiver coils in the MRS apparatus (e.g., $\beta$=arctan (imaginary part/real part)). By analogy, in a two dimensional case the raw data is a matrix of complex numbers with phases $\beta 1$ that vary with x and y.

Figure 4A:
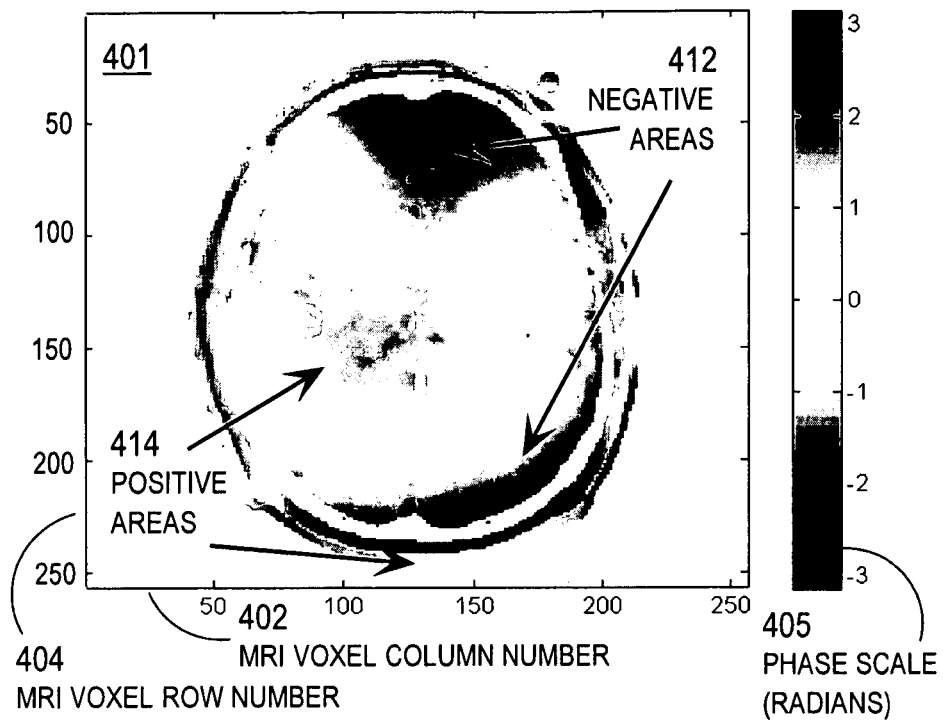
FIG. 4A is a scan that illustrates an example phase map from a two-dimensional MRI scan of a human brain at a first echo time (TE1), according to an embodiment.

FIG. 4A is a scan 401 that illustrates an example phase map from a two-dimensional MRI scan of a human brain at a first echo time (TE1), according to an embodiment. The horizontal axis 402 is MRI voxel column number. The vertical axis 404 is MRI voxel row number. A voxel at a particular row on a particular column has a degree of gray that indicates the phase. The gray value associated with each phase value, in radians, is given by the phase scale 405. In this gray scale rendering, the large negative and large positive phases are each dark, so negative areas 412 and positive areas 414 are labeled. As can be seen in FIG. 4A, the MRI phase data offers high spatial resolution of the human brain in vivo.

If data is collected after a delay of TE2, then the protons have precessed by an angle associated with a phase $\beta 2$ that is related to the precession frequency. For example, at point $x_A$, $\beta 2$, in units of radians, is given by Equation 13c.

$$\beta 2(x_A) = 2\pi^* f_A {}^* TE2 = 2\pi^* \gamma B(x_A)^* TE2 \tag{13c}$$

The measured MRI signal at position $x_A$ is given by Equation 13d.

$$s2(x_A, TE2) = M0^* \exp(j^*\beta 2) = M0^* \exp(j^* 2\pi^* f_A {}^* TE2) \tag{13d}$$

The raw data from an MRI measurement with echo time=TE2 is a vector of complex number with phases of $\beta 2$ that vary with x. By analogy, in a two dimensional case the raw data is a matrix of complex numbers with phases $\beta 2$ that vary with x and y.

Figure 4B:
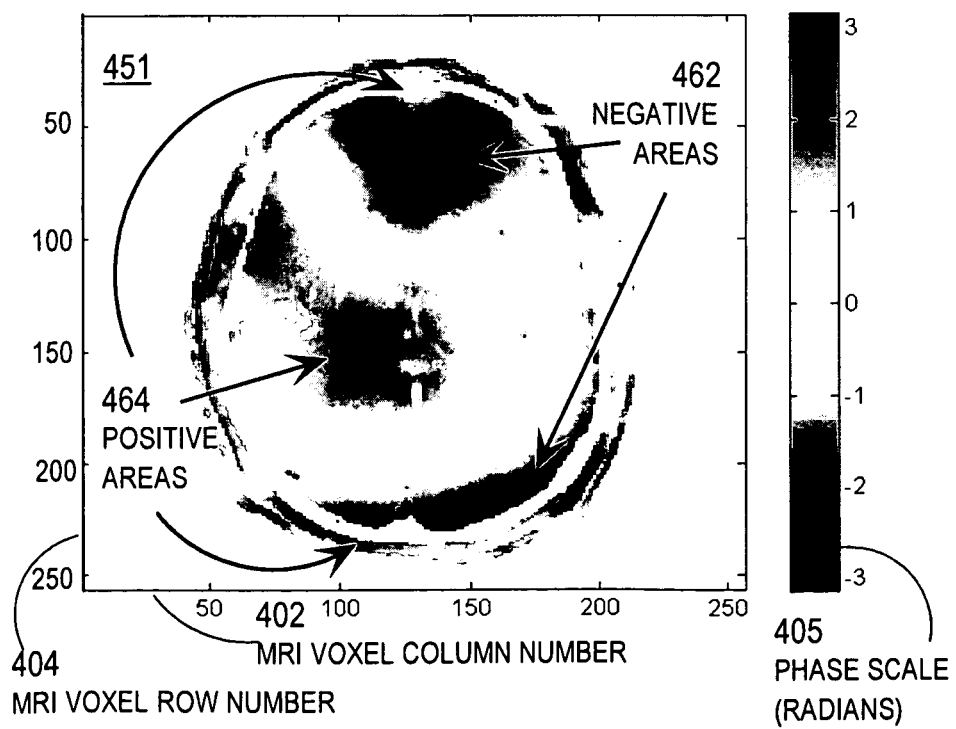
FIG. 4B is a scan that illustrates an example phase map from a two-dimensional MRI scan of the same human brain volume or slice at a second echo time (TE2), according to an embodiment.

FIG. 4B is a scan 451 that illustrates an example phase map from a two-dimensional MRI scan of the same human brain volume or slice at a second echo time (TE2), according to an embodiment. The horizontal axis 402 and vertical axis 404 are as described above for scan 401. The gray value associated with each phase value, in radians, is given by the phase scale 405, as in FIG. 4A. Negative areas 462 and positive areas 464 are labeled. As can be seen in FIG. 4B, the MRI phase data offers a high spatial resolution of the human brain in vivo and differs somewhat from that shown in FIG. 4A for a different echo time.

The only difference between $s1(x_A,t)$ from Equation 13b and $s2(x_A,t)$ from Equation 13d is the phase angles. The phase angle difference is given by Equation 14.

$$\Delta\beta = \beta 2 - \beta 1 \tag{14}$$

The distribution of precession frequency $f_A$ is derived from the spatial distribution of $\Delta\beta$ using Equation 15a and Equation 15b.

$$f_A = \Delta\beta/(2\pi/\Delta t) \tag{15a}$$

$$\text{where } \Delta t = TE2 - TE1 \tag{15b}$$

Differencing on a voxel by voxel basis gives a vector of $\Delta f$ values for 1D MRI data and a matrix of $\Delta f$ values for 2D MRI data.

Figure 3B:
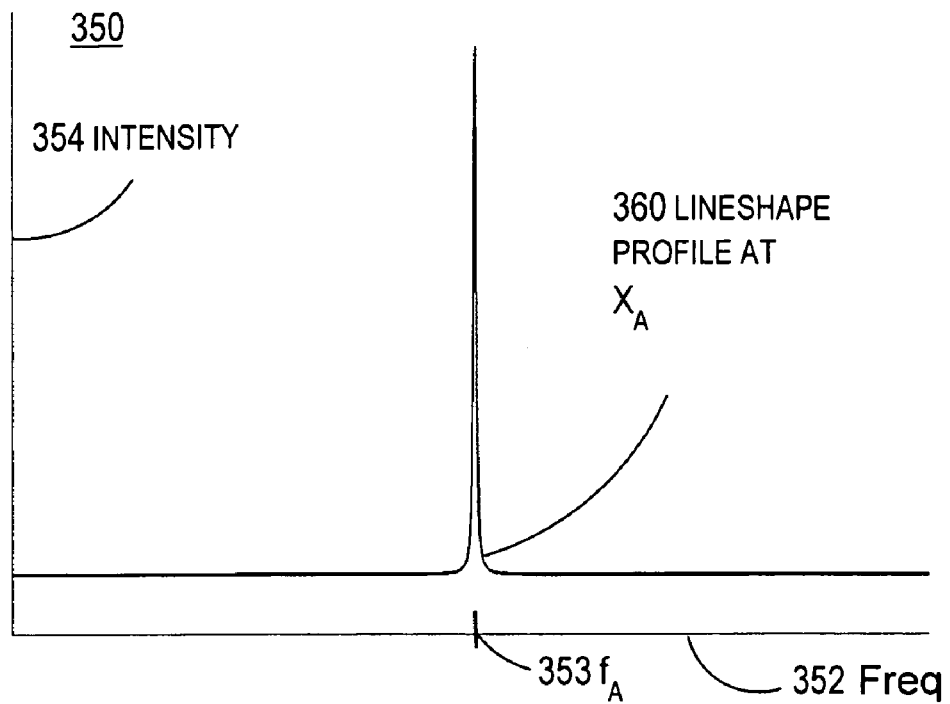
FIG. 3B is a graph that illustrates an example lineshape profile for one location in the one-dimensional high spatial resolution MRI measurement of FIG. 3A, according to an embodiment.
Figure 3C:
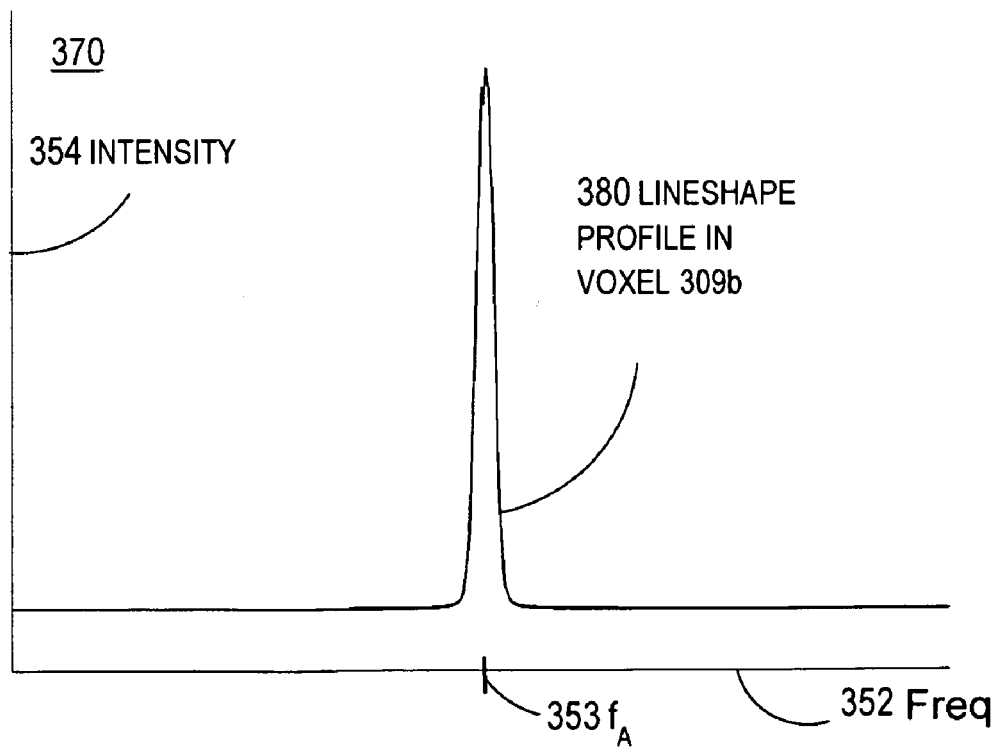
FIG. 3C is a graph that illustrates an example lineshape profile for one location in the one-dimensional low spatial resolution MRSI measurement, according to an embodiment.

If there is frequency dispersion, such as caused by variations in the static magnetic field $B_0$, then the difference in the two measured values s1(x,t) and s2(x,t) at different positions x, corrected for different values of the gradient G, will not reflect the same value of f. The spread of frequency among close positions is denoted the dispersion, $\Delta f$. A lineshape profile for an MRS volume is based on the dispersion of f at all MRI voxels within an MRS volume, as described in more detail in a later section. For purposes of illustration, an example lineshape profile associated with the value $f_A$ is depicted in FIG. 3B, e.g., for one high resolution MRI voxel at location $x_A$ within MRSI voxel 309b. FIG. 3B is a graph 350 that illustrates an example lineshape profile for the one-dimensional high spatial resolution MRI measurement of FIG. 3A, according to an embodiment. In the time domain the lineshape profile is an oscillating function with a period related to $f_A$. The Fourier transform to the frequency domain shows a peak at $f_A$ with width related to the intrinsic linewidth, so the lineshape profiles are shown in the frequency domain. The horizontal axis 352 is frequency; and, the vertical axis 354 is intensity. A lineshape profile 360 is plotted, which shows a peak at $f_A$. The peak shape is Lorentzian and the width is very small for lineshape profile 360. FIG. 3C is a graph 370 that illustrates an example lineshape profile for the one-dimensional low spatial resolution MRSI measurement, according to an embodiment. The frequency axis 352 and intensity axis 354 are as described above for FIG. 3B. The lineshape profile 380 is plotted for MRSI voxel 309b based on Equation 10. With an inhomogeneous $B_0$ across the MRSI voxel 309b, the peak shape is distorted and non-Lorentzian, and the width, broadened by $\Delta B$ (related to frequency dispersion $\Delta f$), is many times wider for lineshape profile 380 compared to lineshape profile 360.

Figure 4C:
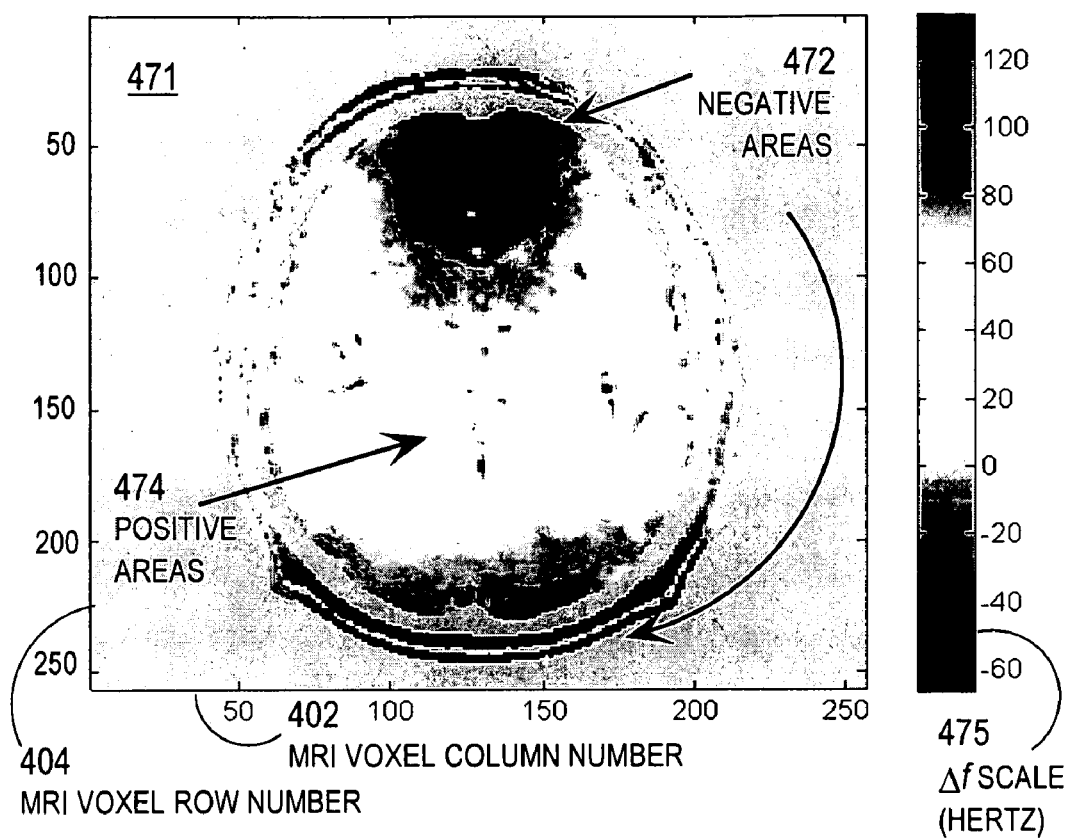
FIG. 4C is a scan that illustrates an example magnetic field map that depicts frequency dispersion based on the phase maps of FIG. 4A and FIG. 4B, according to an embodiment.

FIG. 4C is a scan 471 that illustrates an example magnetic field map that depicts frequency dispersion based on the phase maps of FIG. 4A and FIG. 4B, according to an embodiment. The horizontal axis 402 and vertical axis 404 are as described above for scan 401. The gray value associated with each dispersion value, in Hertz, is given by the $\Delta f$ scale 475. Negative areas 472 and positive areas 474 are labeled. As can be seen in FIG. 4C, the MRI derived dispersion data offers a high spatial resolution of $\Delta f$ in the human brain in vivo. The values of $\Delta f$ vary from −60 to 120 Hz. The values in this scan are proportional to B variations (e.g., $\Delta B_0$) by the gyromagnetic ration $\gamma$, according to Equation 12, and so scan 471 indicates the magnetic field variations and is therefore called the field map or magnetic field map.

In an illustrated embodiment, MR images in the complex format were reconstructed from wavenumber space data by applying spatial Fast Fourier Transform (FFT) processing, well known in the art, following a 2D spatial filtering with a Hamming window function, also well known. The phase unwrapping procedure was performed using a program provided by Dr. Peled (see, N. Saad, S. Peled, "Easy 3D Phase Unwrapping", *Proc. Intl. Soc. Mag. Reson. Med.* 13 (2005), p2251). However, complex conjugate multiplication of the paired MR images with different TEs were used as the input instead of the individual MR images for computational efficiency and robustness, as described in Meyer C, Irarrazabal P., "Magnetic field inhomogeneity correction in MRI using estimated linear magnetic field map," U.S. Pat. No. 5,617,028, 1997. These unwrapped phase images were converted into field maps as represented by the frequency deviations across the slices.

3.2 Lineshape Profile

In step 750, the effects of the frequency dispersion determined during step 730 is de-convolved from the MRS echo data. Any method may be used to do this. In the illustrated embodiment, a lineshape profile is first determined that is matched to each MRS volume (voxel) in the MRSI.

Figure 5:
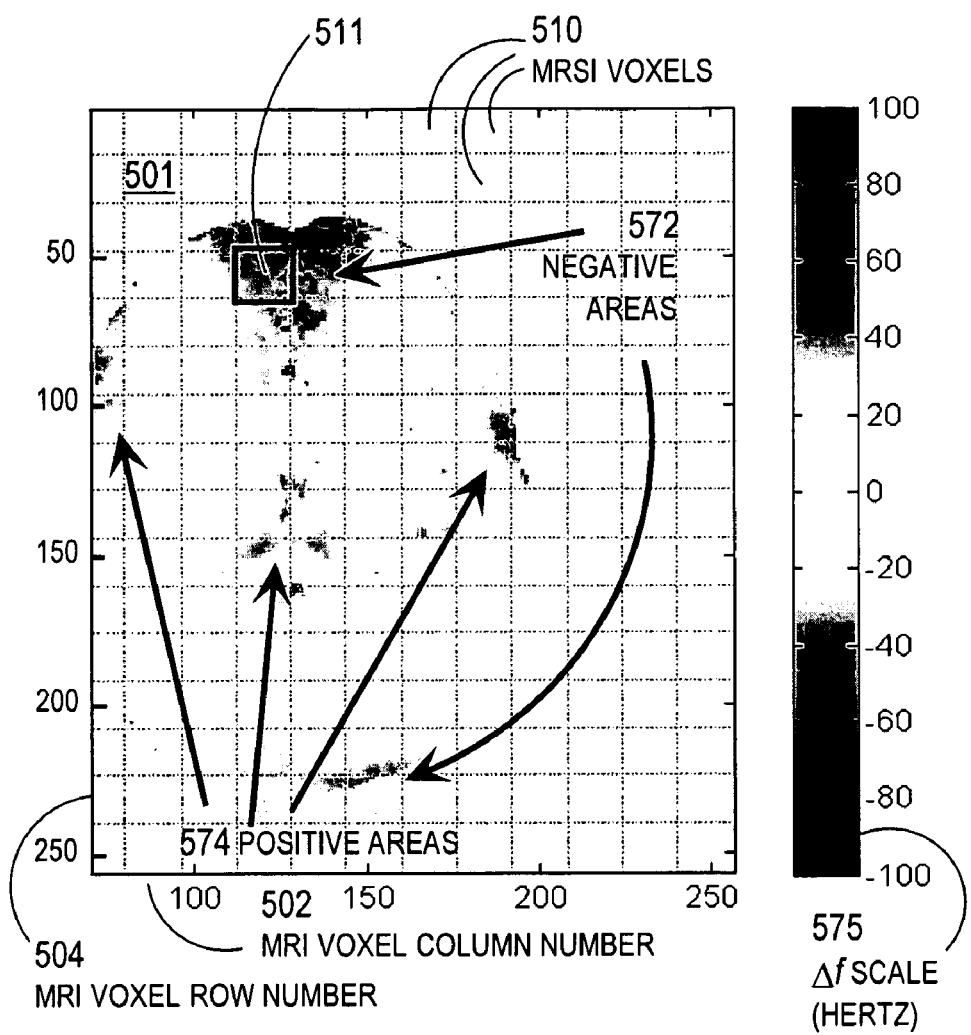
FIG. 5 is a scan that illustrates an example magnetic field map from MRI data and corresponding magnetic resonance spectroscopy (MRS) volumes for MRSI, according to an embodiment.

FIG. 5 is a scan 501 that illustrates an example magnetic field map from MRI data and corresponding magnetic resonance spectroscopy (MRS) volumes for MRSI, according to an embodiment. The horizontal axis 502 is MRI voxel column number; and the vertical axis 504 is MRI voxel row number, as in FIG. 4A. A voxel at a particular row on a particular column has a degree of gray that indicates the frequency dispersion, as in FIG. 4C. The gray value associated with a $\Delta f$ value, in Hertz, is given by the $\Delta f$ scale 575. In this gray scale rendering, the large negative and large positive phases are each dark, so negative areas 572 and positive areas 574 are labeled. Also shown in FIG. 5 are MRSI voxels 510, including a particular MRS volume 511. As can be seen in FIG. 5, the MRI data offers a high spatial resolution of the frequency dispersion $\Delta f$ within each MRS volume (e.g., each MRSI voxel 510, 511).

In the illustrated embodiment, the lineshape profile for each voxel in the matrix of a 2D MRSI slice was determined from these field maps as follows to match the processing of each MRS volume. Synthetic echo signals with the form of $$e^{j2\pi\Delta f(v_i)t_d}$$

were synthesized for MRI voxels in an MRI slice. The values $\{\Delta f_i\}$ were obtained from the field mapping and $\{t_d\}$ started from a negative value synchronized with the start of data acquisition of the pulse sequence so as to form echoes at the time point $t_d=0$. This gives a 3D dataset, with two spatial dimensions of the same resolution as the MRI and one spectral dimension of the same spectral resolution as the actual MRSI data. The above procedure is repeated for all MRI slices; and the datasets corresponding to each MRSI slice are added together. A series of 2D spatial inverse Fourier Transforms were performed to transform the spatial signals for all MRSI slices back into wavenumber space. The resulting lineshape profile is $L_V(t_d)$ given by Equation 16a.

$$L_V(t_d) = \int_V e^{(j2\pi\Delta f(\vec{r})t_d)} d\vec{r} \tag{16a}$$

where j is the square root of −1. Note that the phase encoding dimension in the wavenumber space is the same as the spatial dimensions of the MRI slice (e.g., 256×256). The wavenumber space data in the two phase encoding dimensions is cropped into the size of the phase encoded wavenumber space in the MRSI (e.g., 24×24). In the illustrated embodiment, the non-zero wavenumber space data were in an inscribed circle in the square of the nominal phase encoded wavenumber space. The cropped wavenumber space data is filtered with the Hamming window function as done for the measured MRSI data. The data then undergo another Fourier Transform back into spatial domain with a half voxel shifting in both x and y directions.

In some embodiments, the lineshape profile can be obtained by directly simulating the phase encoding procedure of the real-world MRSI data acquisition. In this realization, the synthesized echo (e.g., the synthesized FID signals) are modified by multiplying them with phase encoding functions in the form of $\exp(j2\pi \vec{k}_n \cdot \vec{r})$, and by integrating the product over the whole MRSI volume V. The resultant lineshape signal for the voxel V is $|L_V(t_d, k)|$ given by Equation 16.

$$L(t_d, \vec{k}_n) = \int_V e^{j2\pi(\vec{k}_n \cdot \vec{r}) + j2\pi\Delta f(\vec{r})t_d} d\vec{r} \tag{16b}$$

where $k_n$ is the wavenumber vector in wavenumber space and $\vec{r}$ is the position vector in real space. $\{\vec{k}_n\}$ can be 1D, 2D, or 3D and their values are the same as those used in the MRSI scan, with a 2 dimensional case given in Equation 6a.

3.3 Corrected Echo Data

In some embodiments, step 750 includes de-convolving the lineshape profile for an MRS voxel from the echo data to produce corrected echo data. In the illustrated embodiment, spectral de-convolution was based on Equation 9. Ideally, this de-convolution eliminates the linebroadening caused by the field inhomogeneity; and spectra are obtained with natural linewidths.

A 3D lineshape signal (2 spatial dimensions and 1 spectral dimension) for each MRSI slice and at the in-plane resolution of the MRSI voxel was constructed from field maps within the MRSI slice, using the method described above.

However, at both ends of the echo, the amplitude of the time-domain lineshape profile in the denominator approaches zero. Two adverse consequences may result: 1] when the profile decays to the noise level of the acquired signal and below, noise amplification may occur; and 2] when the amplitude of the profile approaches zero, spikes may appear in the de-convolved signal.

To suppress the noise at the ends of the echo and the spikes at zero-reaching points, a modified Wiener filtering window was applied to the signal. Therefore, the de-convolution was performed as expressed by Equation 17a.

$$s_V^0(t_d) = s_V(t_d) \cdot w(t_d)/L_V(t_d) \tag{17a}$$

where $L_V(t_d)$ is the lineshape function taking the PSF effects into account, computed as described above in Equation 16a (or Equation 16b in some embodiments) for each MRS voxel, and $w(t_d)$ is the time domain modified Gaussian-Wiener window function as defined in Equation 17b.

$$w(t_d) = G(t_d) \frac{|L_V(t_d)|^2}{|L_V(t_d)|^2 + \alpha K_V(t_d)} \tag{17b}$$

where G is the Gaussian function, α is a scaling constant defined in Equation 17c and $K_V$ is defined in Equation 17d.

$$\alpha = L_{V,max}/S_{v,max} \quad (17c)$$

and $$K_V(t_d) = \frac{\sigma^2}{|s_V(t_d)|^2} \quad (17d)$$

where $\sigma^2$ is the noise power calculated according to Equation 17e.

$$\sigma^2 = \overline{\sum_\delta |s_V(t_\delta)|^2} \quad (17e)$$

where δ indicates the last, e.g. ⅛ th, points of the uncorrected echo (e.g., the FID).

Although the de-convolution without Wiener filtering can ideally recover the spectra with natural linewidth, its performance is vulnerable to noise and to the zero-crossing points at the end of the time domain signal. Therefore the Wiener filtering was used in the spectral de-convolution in an illustrated embodiment. The results show that with Wiener filtering the performance of the de-convolution is more stable and robust. In case the first few points of the time domain signal were corrupted by the switching of the analog-to-digital converter (ADC), a cosine window function is applied in some embodiments. The cosine window acts mainly on the corrupted points to increase the robustness of the method. Because the signals at the ends of the echo are very small, the cosine factor of the window function has little effect on the lineshape of the resultant spectrum after de-convolution. In various other embodiments other filtering windows are applied, including but not limited to Gaussian, Cosine-Gaussian, Lorentzian, Cosine-Lorentzian, modified Cosine or Half-Cosine, alone or in some combination.

In an illustrated embodiment, the uncorrected echo data $s_V(t_d)$ is also conditioned before performing the de-convolution given by Equation 17a. The measured wavenumber space MRSI data were Fourier transformed into spatial domain following a Hamming window filtering and a half voxel shifting, which is the same as a step in lineshape profile formation for the illustrated embodiment, described above. The water residue in each voxel spectrum is removed using the SVD-based Matrix Pencil Method because it can eliminate water components without phase distortion. The resultant signal for the MRS voxel V is still denoted by $s_V(t_d)$. The spatial time domain MRSI data after water-removal were submitted to the de-convolution procedure represented by Equation 17a. After de-convolution, the time domain data were zero-padded to 2048 points and transformed to frequency domain to obtain the more ideal MR spectrum. In various other embodiments, other conditioning is used, such as applying a window function selecting from a group including, among others, a Hamming window, a Hanning window, and a Gaussian window, alone or in any combination.

In the illustrated embodiments, all programs used for implementing SPREAD were written in MATLAB™ (The MathWorks, Inc, Natick, Mass.). The most time-consuming part of SPREAD is the reconstruction of the lineshapes from the field maps. For an MRSI slice consisting of 5 MRI field mapping slices with 256×256 in-plane MRI resolution, the reconstruction of the lineshapes of 16×16 MRSI voxels took about 32 seconds on a PC with a 4G Hz processor.

Synchronization of the time domain signals, to align the peaks of the echoes, is beneficial for the procedure of de-convolution in some embodiments, otherwise the resultant signal would suffer from phase and lineshape distortions, as well as deteriorated spectral resolution. The position of the echo peak is calculated from the timing of the pulse sequence and, if needed, is adjusted by measuring the echo of the water signal acquired in a single voxel MRS using the same pulse sequence and timing, but without phase encoding. In various other embodiments, other synchronization methods are applied. Once the position is determined, the value is used in forming the lineshape signals according to the field maps for all MRSI data acquired with the same timing parameters.

3.4 Enhanced Spectrum

Figure 6A:
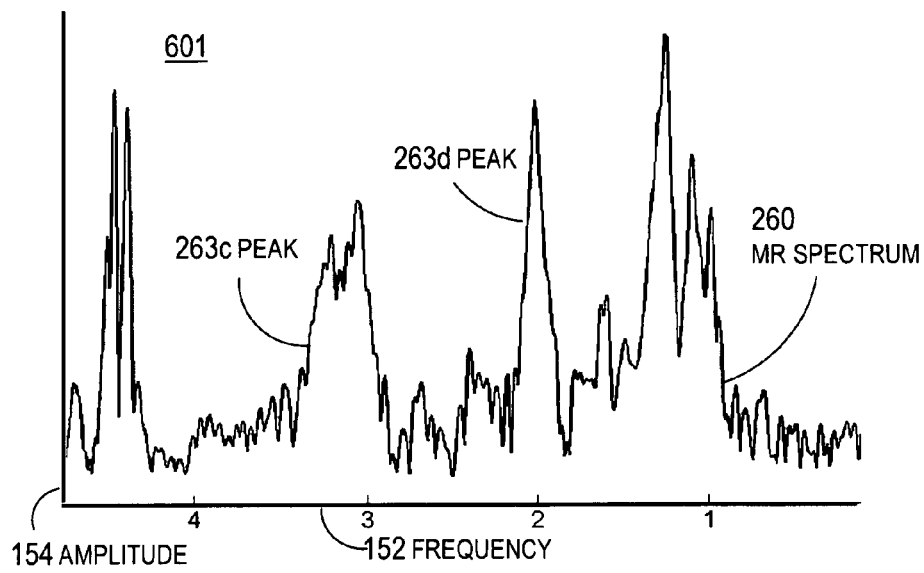
FIG. 6A is a graph that illustrates the example non-ideal spectrum using an MRS system for an MRS volume of FIG. 5, as illustrated in FIG. 2.

FIG. 6A is a graph 601 that illustrates the example non-ideal spectrum, which is the Fourier transformation of the time domain signal $s_V(t_d)$, using an MRS system for an MRS volume 511 of FIG. 5. The horizontal axis 152 and the vertical axis 154 are the same as in FIG. 2. The MR spectrum 260 and peak 263c and peak 263d are the same as in FIG. 2.

Figure 6B:
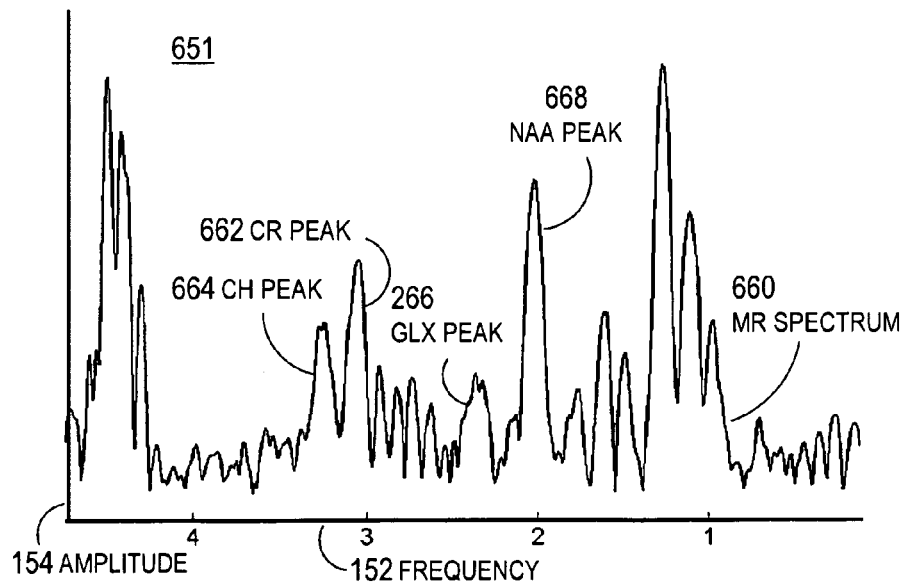
FIG. 6B is a graph that illustrates an example high spectral resolution spectrum determined based on the magnetic field map of FIG. 5, according to an embodiment.

FIG. 6B is a graph 651 that illustrates an example high spectral resolution spectrum, which is the Fourier transformation of the time domain signal $s^0{}_V(t_d)$, determined based on the magnetic field map of FIG. 5, according to an embodiment. The horizontal axis 152 and the vertical axis 154 are the same as in FIG. 6A. The MR spectrum 660 resolves ambiguous peak 263c into distinct Creatine peak 662 and Choline peak 664; and resolves Glx peak 266. The width and shape of the NAA peak 668 is also improved compared to corresponding peak 263d.

4. Apparatus for Enhancing Spectral Resolution of MRS Data

In some embodiments, one or more steps of the method 700 are incorporated into an MRS scanning system or apparatus. FIG. 8 is a block diagram that illustrates an example MRS system 800, according to an embodiment. The system 800 includes a scanning apparatus 802 and a computer/controller 880. Although a subject 890 for MRS scanning is depicted in FIG. 8, subject 890 is not part of the MRS system 800.

The scanning apparatus 802 includes a $B_0$ magnet 810, an x-gradient magnet 812, a y-gradient magnet 814, a z-gradient magnet 816, a group of shim coils (e.g., shim coils 811a and 811b), a radio frequency (RF) transmitter 820, an RF receiver 824, a communications interface 840, and a processor 850. As depicted, the components of scanner 802 are standard and well known in the art.

The computer/controller 880 sends signals to the communications interface 840 in scanner 802 that causes the scanner to operate the gradient magnets 812, 814 and 816 and the RF transmitter 820 and RF receiver 824 to obtain NMR data.

In the illustrated embodiment, computer/controller 880 includes process 860 to enhance spectral resolution. Process 860 performs one or more steps of method 700. For example, process 860 causes scanner 802 to collect MRSI echo data at each of 24×24 MRSI voxels (e.g., voxels 510 depicted in FIG. 5) and to collect complex MRI data at each of 256×256 MRI voxels for each of two echo times, TE1 and TE2. The collected data is received at computer/controller 880 or another computer and used to determine MRSI spectra with enhanced spectral resolution, using additional steps of method 700.

In some embodiments, process 860 is performed by processor 850 within scanner 802. In various embodiments, one or more steps of method 700 are performed by multiple processors on scanner 802 or computer/controller 880 or other computers connected to computer/controller 880 via a network.

5. Example Embodiments

Figure 9A:
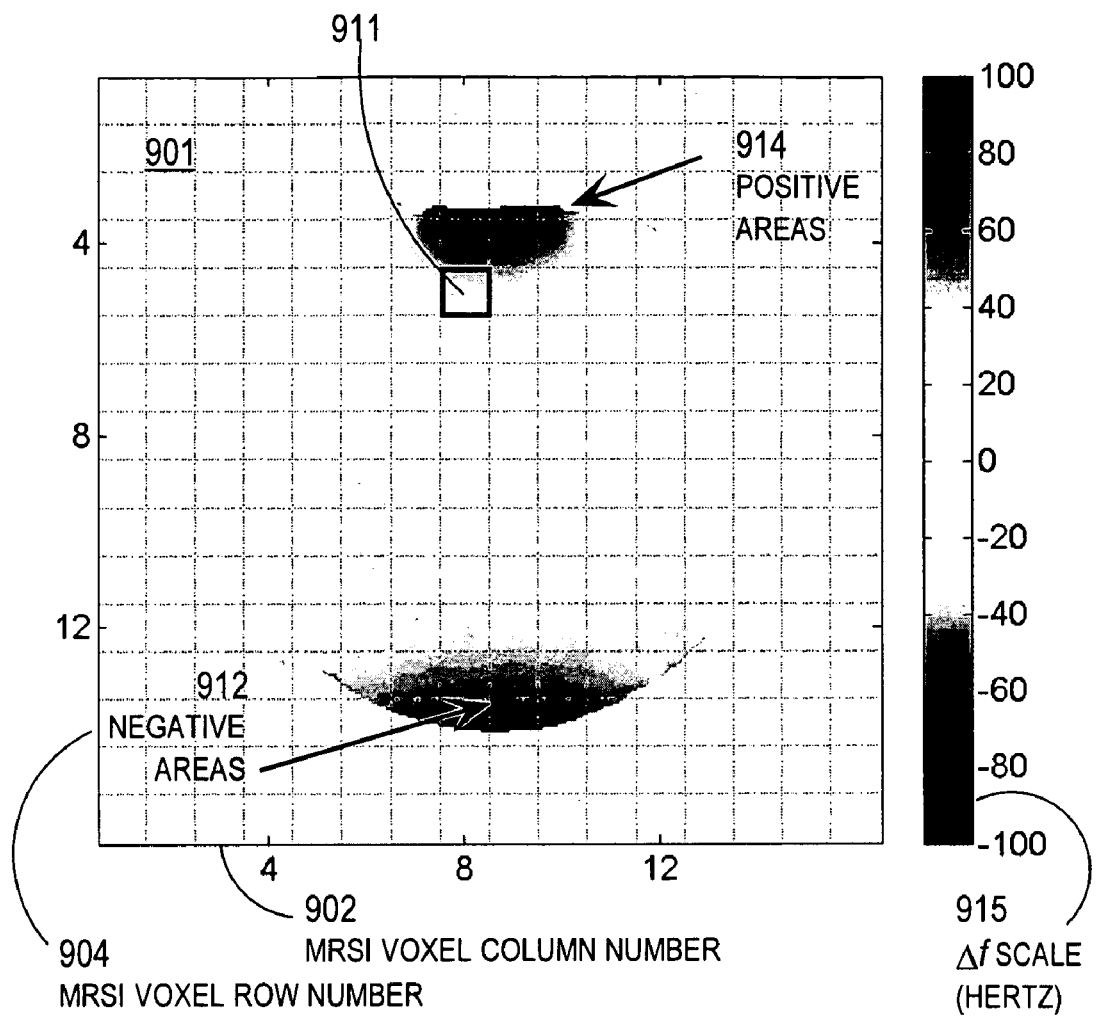
FIG. 9A is a scan that illustrates an example magnetic field map that depicts frequency dispersion in a phantom, according to an embodiment.

In an example embodiment, the subject was a spectroscopy phantom. The field homogeneity was deliberately destroyed in the y-direction by changing shimming parameters. Severe field inhomogeneity was seen in the interface between liquid and air. Thus the linewidth of the MRS peak for protons in water was increased and the lineshape distorted. Because the water concentration was homogenous in the phantom, the linewidth and lineshape could only be altered by spatial variation of the magnetic field. Using the MRI field mapping data, lineshapes in the frequency domain were constructed as described above and compared to the measured peaks of $^1$H in water. FIG. 9A is a scan that illustrates an example magnetic field map that depicts frequency dispersion in a phantom, according to an embodiment. The scan is divided onto a grid that corresponds to MRSI voxels. The horizontal axis 902 is MRSI voxel column number. The vertical axis 904 is MRSI voxel row number. The grayscale bar indicates the $\Delta f$ scale in Hertz. Because both large negative and large positive values are dark, the dark negative areas 912 and dark positive areas 914 are indicated in the scan 901. MRSI voxel 911 is indicated for which spectra are computed.

In the MRSI voxels adjacent to the liquid-air interface, such as MRSI voxel 911, the lineshapes were severely distorted and the linewidth was broadened. FIG. 9B is a graph 920 that illustrates an example MRS measurement of the spectrum of water in an MRSI voxel 911 of the phantom. The horizontal axis 922 is frequency sample points. The vertical axis 924 is intensity in arbitrary units. The measured lineshape profile 930 is distorted and broad. FIG. 9C is a graph 940 that illustrates an example reconstructed lineshape profile for the MRS voxel based on integrating the lineshape profiles of the MRI voxels in the MRSI voxel, according to an embodiment. The horizontal axis 922 is frequency sample points, as in FIG. 9B. The vertical axis 944 is intensity in arbitrary units. The reconstructed lineshape profile 950 based on integrating the dispersion terms from the MRI voxels over the MRSI voxel 911 is plotted. It is noted that these lineshapes can not be described by Lorentzain, Gaussian, and Voigt functions and constitute a challenge for the spectral fitting. The computed lineshapes in such MRSI voxels are identical to measured lineshapes of water. However, the widths of the computed lineshapes are narrower than those of water, because the measured water signal has an intrinsic linewidth that is not included in the computed linewidths.

Figure 9E:
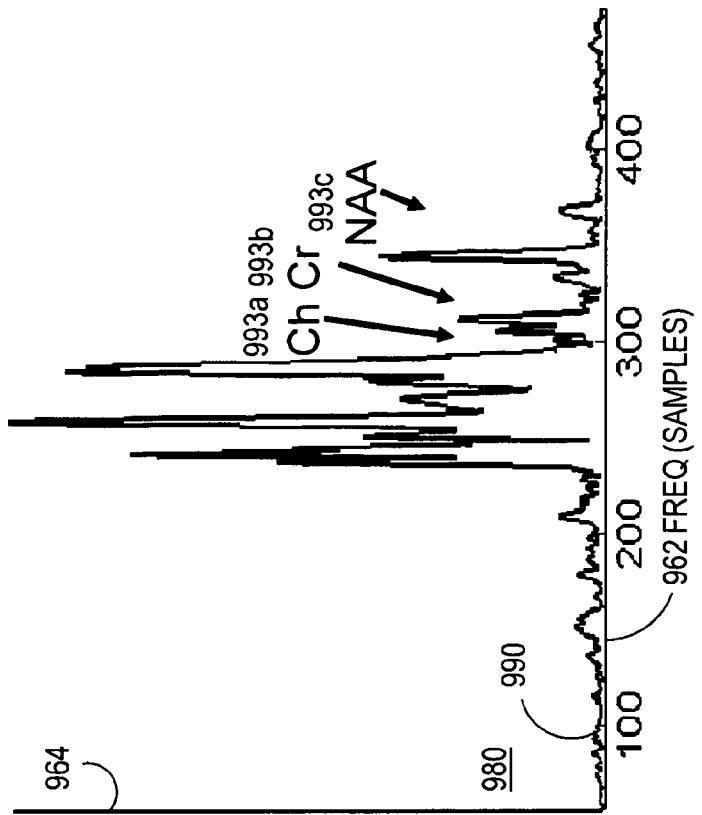
FIG. 9E is a graph that illustrates an example MR spectrum corrected by the lineshape profile of FIG. 9C after removing the water peak, according to an embodiment.
Figure 9D:
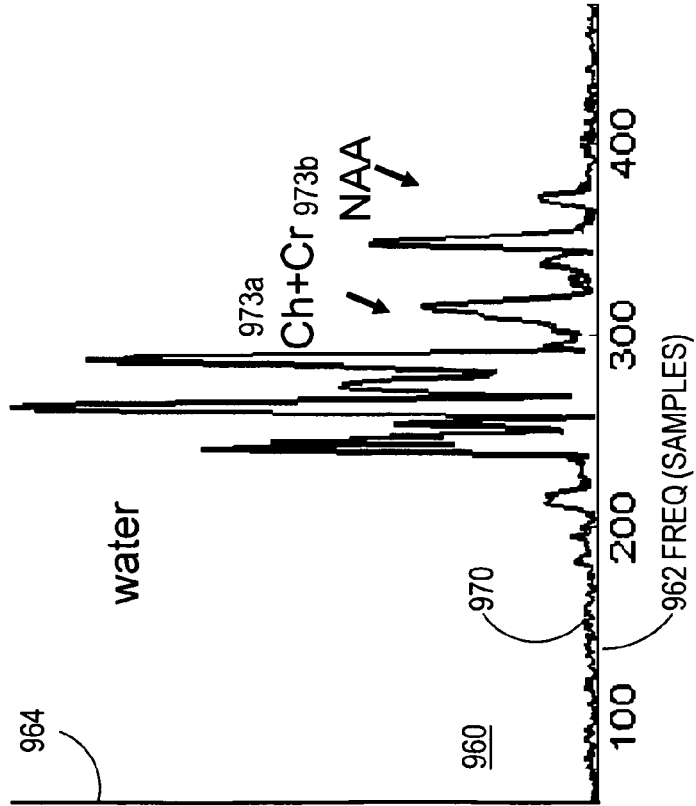
FIG. 9D is a graph that illustrates an example MR spectrum from the MRSI voxel after removing the water peak, according to an embodiment.

A spectrum from a voxel in the region with strong magnetic field inhomogeneity in the phantom was observed, in which the peaks of Creatine (at 3.04 MHz) and Choline (at 3.24 MHz) severely overlap and can not be resolved. FIG. 9D is a graph 960 that illustrates an example MR spectrum from the MRSI voxel 911 after removing the water peak, according to an embodiment. The horizontal axis 922 is frequency sample points. The vertical axis is intensity in arbitrary units. Data were measured with water suppression. Residual water was further suppressed by SVD-based method. However, the water residue is still sizable because of its bad lineshape. The residual spectrum 970 is plotted and includes a peak 973a and peak 973b. FIG. 9E is a graph 980 that illustrates an example MR spectrum corrected by the lineshape profile of FIG. 9C after removing the water peak, according to an embodiment. The horizontal and vertical axes are as described for FIG. 9D. The residual spectrum 990 is plotted and includes a peak 993a, peak 993b and peak 973c. After SPREAD treatment, the peak 973a is clearly separated into two peaks 993a and 993 for Choline and Creatine, respectively, which therefore could be easily resolved. Furthermore the distorted NAA peak 973b is resolved as peak 993c with a better, more-Lorentzian lineshape.

Compared to the magnetic field for the phantom, the magnetic field in the human brain is highly inhomogeneous (see for example, FIG. 4C and FIG. 5). Consequently, the metabolite spectrum exhibits severe spectral overlap, lineshape distortion and linebroadening (see for example, FIG. 6A for MRS volume 511). As a result, the overlapping Cr and Cho peaks can not be resolved from peak 263c. In addition, the singlet NAA peak 263d can not be fitted accurately, because of the lineshape distortion. After de-convolution by SPREAD (see for example, FIG. 6B), the adjacent Cr and Cho peaks 662 and 664, respectively, are very well separated and the lineshape distortion for NAA peak 668 is corrected.

In the illustrated embodiments, the effect of eddy current on the lineshape is not included and therefore the lineshape distortion caused by eddy current is not corrected. This may prevent the application of such embodiments to very short echo time, when an eddy current effect may be pronounced. However, this constraint is very weak for modern scanners equipped with active shielding and therefore the eddy current effects are practically small. In some embodiments, the effect of eddy currents is included explicitly.

In the illustrated embodiment, additional measurement time for the field mapping images is involved. However, the increase in time is only three to eight minutes, which is a small portion of the total MRSI measurement time.

In the illustrated embodiments, use is made of a standard quadrature coil as the RF receiving antenna. In other embodiments, use is made of a multi-channel coils as the RF receiving antenna. Such embodiments involve more robust field mapping techniques, because the SNR of the images from individual coil components vary dramatically across the field of view.

In another embodiment, improved spectral resolution is applied to the human lower leg. The accurate measurement of intramyocellular lipids (IMCL) in muscle is important for understanding lipid utilization in a variety of diseases, such as diabetes. However, such measurements can be obscured by overlap with extramyocellular lipids (EMCL). Traditionally, IMCL has been measured by biopsy. In recent years, proton MRS and MRSI have been employed to assess EMCL and IMCL stores in vivo. The spectral lines of EMCL and IMCL depend on both their chemical shifts and the "bulk magnetic susceptibility" (BMS) effects of EMCL, with the latter being altered by the orientation of the muscle fiber with respect to the external magnetic field $B_0$. While the main IMCL peak appears at 1.3 ppm, the peak of EMCL may spread in the range of 1.3-1.5 ppm, depending on the fiber orientation related to $B_0$.

Due to the dual inhomogeneities of the magnetic fields, $B_0$ and local BMS, the proton MRS of calf muscle suffer from severe spectral overlap. As a result, accurate separation of the spectral peaks of EMCL and IMCL, and therefore, accurate measurement of IMCL are difficult. The SPREAD method was applied to improve the spectral resolution of proton MRSI acquired on the aforementioned scanner at 3 T.

In this embodiment, measurements were on the right legs of two healthy male volunteers. The protocol was approved by the local Institutional Review Board. MR scans were carried out on a 3 T whole body scanner (GENERAL ELECTRIC™, of Fairfield, Conn.) with a home-built bird cage coil (inner diameter 14 cm) serving as transmitter and receiver.

Commercial MRSI sequence with PRESS localization (PROBE-P CSI) was used for MRSI data acquisition. The parameters are as follows: Field of View=17 cm×17 cm; number of slices=1; slice thickness=12 mm; number of phase encoding=32×32; spectral width=4000 Hz; number of data points in FID=1024; TR/TE=1200 ms/27 ms; total scan time=21 min.

Immediately following the MRSI scan, MR images were measured for the purpose of field mapping. A commercial MRI sequence 2 dimensional SPGR was used for data acquisition. The parameters are as follows: FOV=17 cm×17 cm; slice thickness=3 mm; number of slices=6; number of TEs=2 (TE1=2.3 ms and TE2=5.8 ms); TR=500 ms; SW=50 MHz; flip angle=60 degree. The MRI volume completely covered the MRSI volume and the MRI slices were parallel to MRSI slice. Automatic shimming was turned off. Complex raw data were saved in addition to the conventional images in DICOM format.

Figure 11:
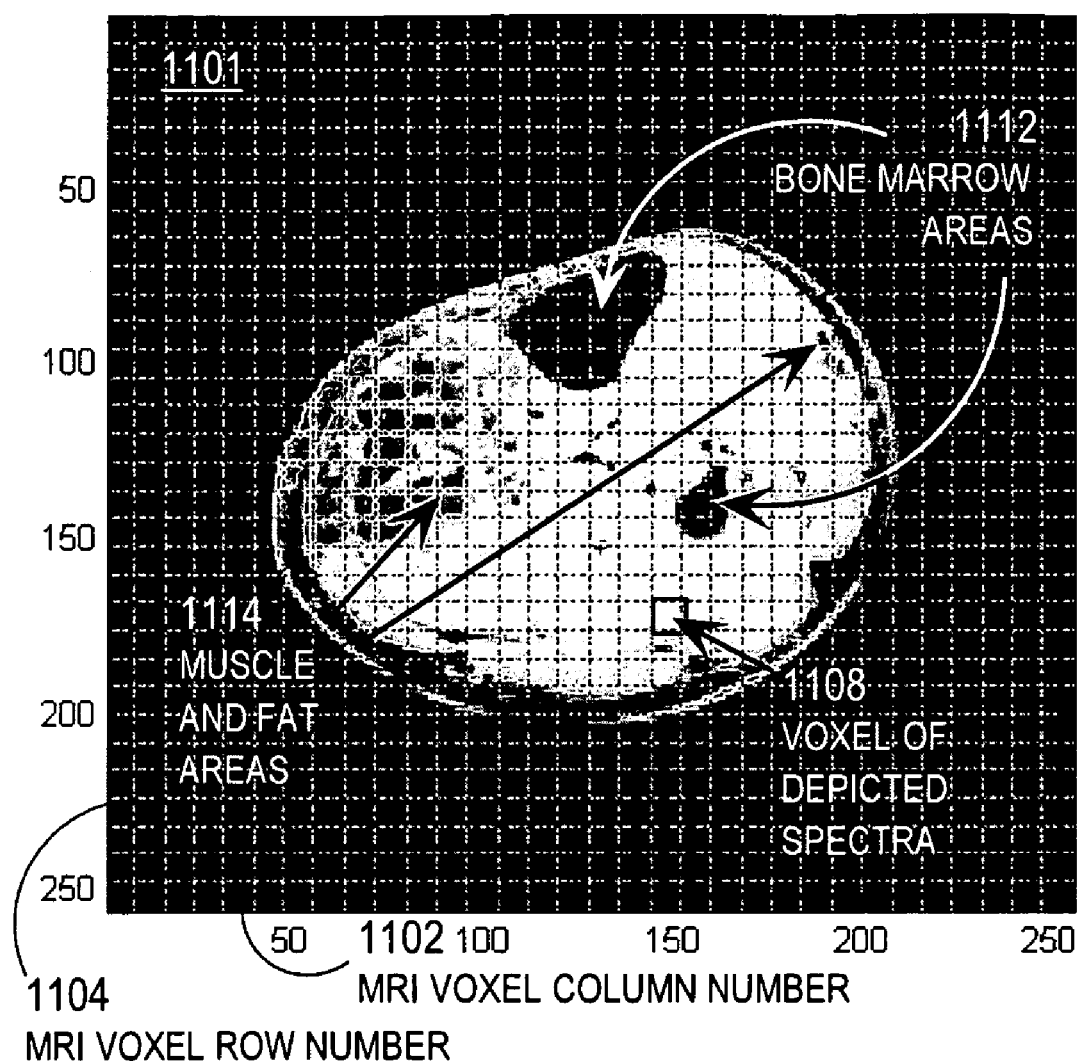
FIG. 11 is a scan that illustrates an example MRI image that depicts anatomical structure in a human leg, according to an embodiment.
Figure 12:
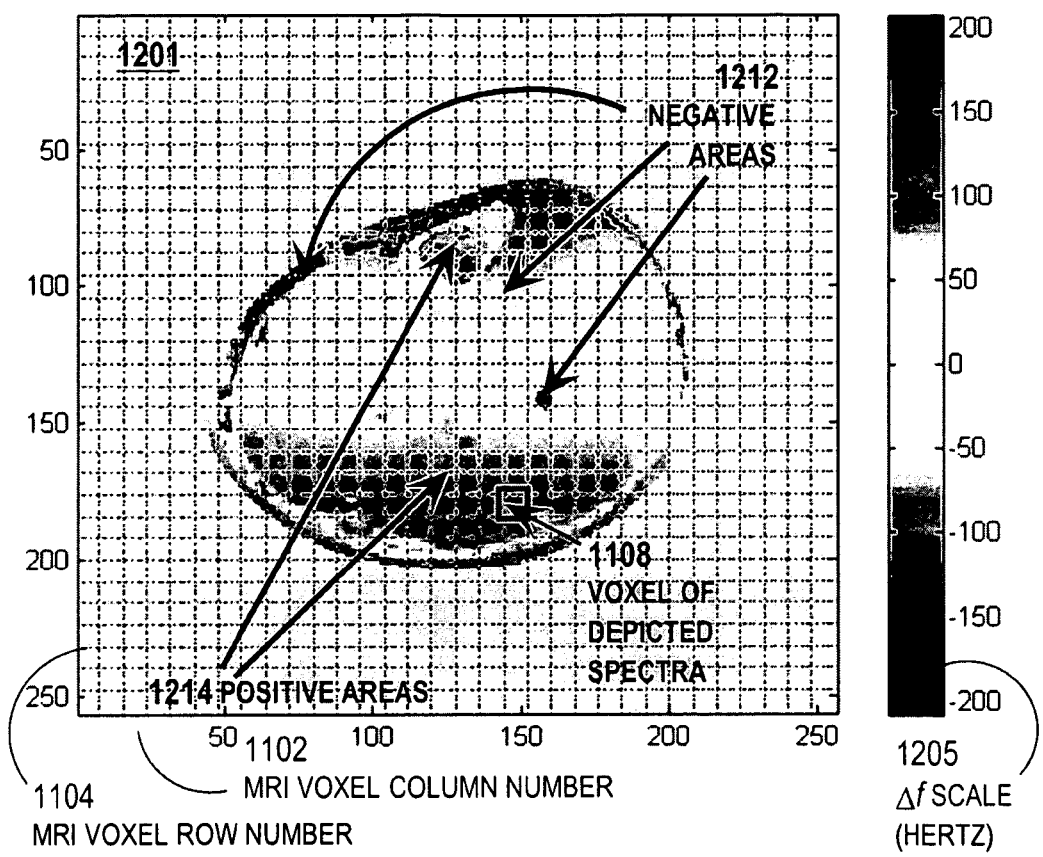
FIG. 12 is a scan that illustrates example MRI images used for magnetic field mapping and corresponding magnetic resonance spectroscopy (MRS) volumes for MRSI in the human leg, according to an embodiment.

FIG. 11 is a scan 1101 that illustrates an example MRI image that depicts anatomical structure in a human leg, according to an embodiment. The horizontal axis 1102 is MRI voxel column number. The vertical axis 1104 is MRI voxel row number. Each pair of the MRI images with different echo times are used to generate the phase maps, from which the field maps are produced (as shown in FIG. 12.). The areas that indicate bone marrow and muscle groups and subcutaneous fat regions are marked. The highlighted box shows the location of the voxel 1108 whose spectrum is shown in FIG. 13.

FIG. 12 is a scan 1201 that illustrates an example magnetic field map calculated from MRI images with two different echo times that depicts frequency dispersion and corresponding magnetic resonance spectroscopy (MRS) volumes for MRSI in the human leg, according to an embodiment. The horizontal axis 1102 is MRI voxel column number; and the vertical axis 1104 is MRI voxel row number, as in FIG. 11. A voxel at a particular row on a particular column has a degree of gray that indicates the frequency dispersion, in Hertz. The gray value associated with a $\Delta f$ value, in Hertz, is given by the $\Delta f$ scale 1205. In this gray scale rendering, the large negative and large positive frequencies are each dark, so negative areas 1212 and positive areas 1214 are labeled. Also shown in FIG. 11 is voxel 1108 whose spectrum is shown in FIG. 13. As can be seen in FIG. 11, the MRI data offers a high spatial resolution of the frequency dispersion Of within each MRS volume (e.g., voxel 1108).

Figure 13:
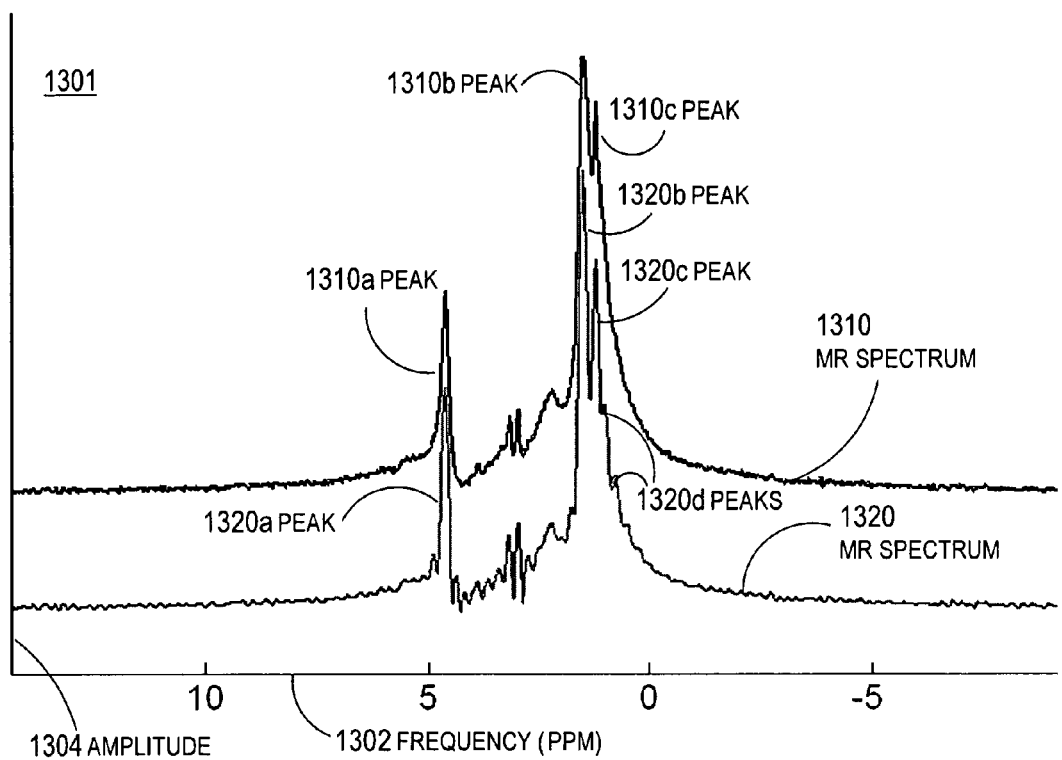
FIG. 13 is a graph that illustrates the example spectra for a voxel in the human leg both with and without the increased spectral resolution; according to an embodiment.

FIG. 13 is a graph 1301 that illustrates the example spectra for a voxel in the human leg both with and without the increased spectral resolution; according to an embodiment. The horizontal axis 1302 is frequency f in parts per million (ppm). The vertical axis 1304 is spectral amplitude in arbitrary units. Plotted in graph 1301 is an MR spectrum 1310 obtained in the conventional way, and spectrum 1320 correcting for dispersion. Spectrum 1310 shows isolated peaks for several components in muscle, including water peak 1310a, EMCL peak 1310b and IMCL peak 1310c. Spectrum 1320 shows more and narrower peaks for several components in muscle, including water peak 1320a, EMCL peak 1320b, IMCL peak 1320c and $CH_3$ peaks 1320d. To facilitate comparison, spectrum 1320 is normalized to the height of spectrum 1310, by equalizing the height of peak of EMCL in 1320 to that in 1310.

Note that the main spectral peak 1310c of IMCL from $(CH_2)_n$ group overlapped severely with the main peak 1310b of EMCL and the $CH_3$ peaks of both EMCL and IMCL (not shown). After SPREAD, the two main peaks 1320b and 1320c are better separated and the small peaks 1320d of $CH_3$ from IMCL and EMCL, respectively, can be seen. These two small peaks can be included in the spectral fitting, for accurate measurement of IMCL. Peak assignment is based on Machann et al. (European Journal of Radiology, v 67, pp 275-484, 2008).

6. Computer Hardware Overview

Figure 10:
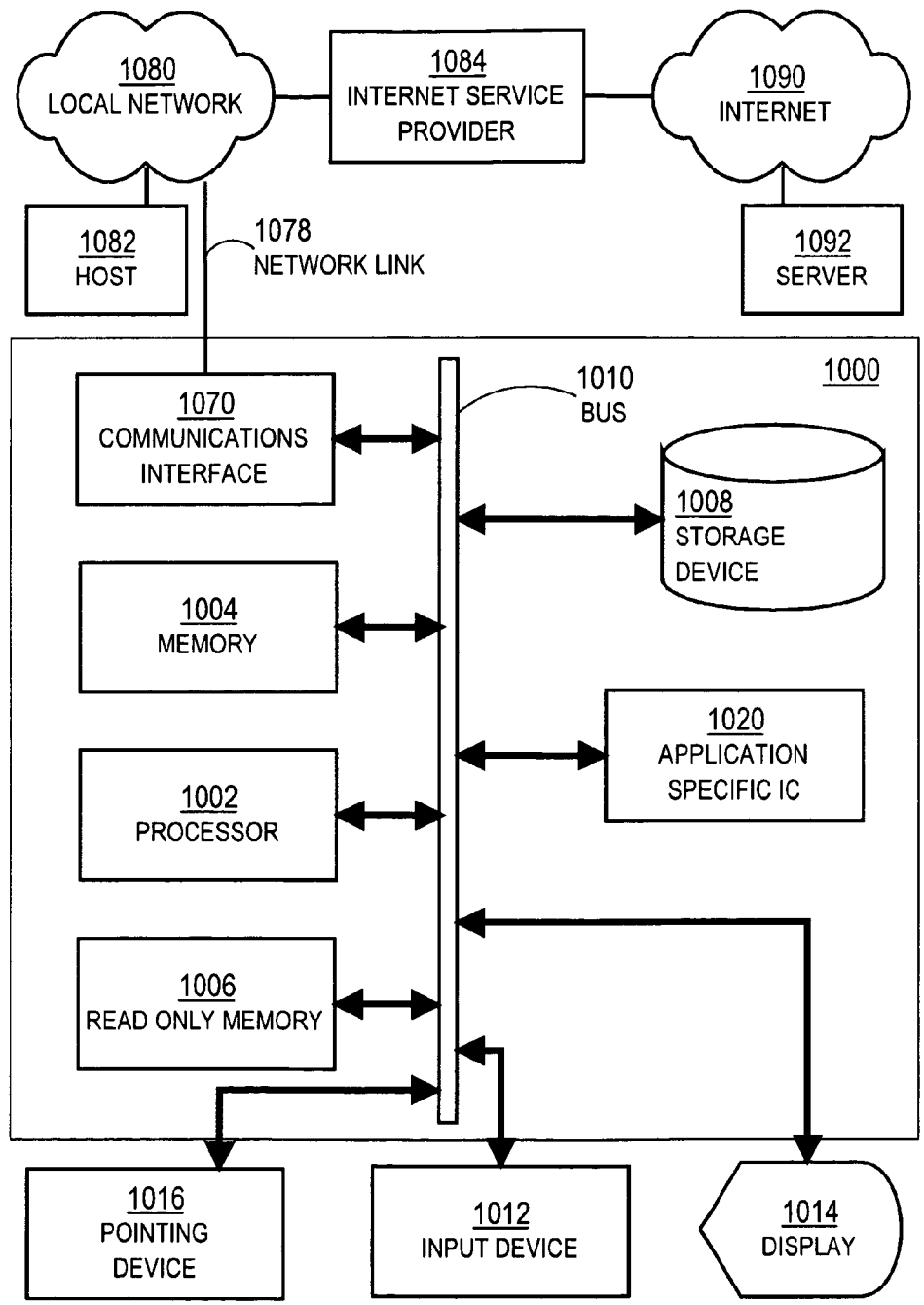
FIG. 10 is a block diagram that illustrates a computer system upon which an embodiment of the invention may be implemented.

FIG. 10 is a block diagram that illustrates a computer system 1000 upon which an embodiment of the invention may be implemented. Computer system 1000 includes a communication mechanism such as a bus 1010 for passing information between other internal and external components of the computer system 1000. Information is represented as physical signals of a measurable phenomenon, typically electric voltages, but including, in other embodiments, such phenomena as mechanical, magnetic, electromagnetic, pressure, chemical, molecular atomic and quantum interactions. For example, north and south magnetic fields, or a zero and non-zero electric voltage, represent two states (0, 1) of a binary digit (bit). A sequence of binary digits constitutes digital data that is used to represent a number or code for a character. A bus 1010 includes many parallel conductors of information so that information is transferred quickly among devices coupled to the bus 1010. One or more processors 1002 for processing information are coupled with the bus 1010. A processor 1002 performs a set of operations on information. The set of operations include bringing information in from the bus 1010 and placing information on the bus 1010. The set of operations also typically include comparing two or more units of information, shifting positions of units of information, and combining two or more units of information, such as by addition or multiplication. A sequence of operations to be executed by the processor 1002 constitutes computer instructions.

Computer system 1000 also includes a memory 1004 coupled to bus 1010. The memory 1004, such as a random access memory (RAM) or other dynamic storage device, stores information including computer instructions. Dynamic memory allows information stored therein to be changed by the computer system 1000. RAM allows a unit of information stored at a location called a memory address to be stored and retrieved independently of information at neighboring addresses. The memory 1004 is also used by the processor 1002 to store temporary values during execution of computer instructions. The computer system 1000 also includes a read only memory (ROM) 1006 or other static storage device coupled to the bus 1010 for storing static information, including instructions, that is not changed by the computer system 1000. Also coupled to bus 1010 is a non-volatile (persistent) storage device 1008, such as a magnetic disk or optical disk or flash drive, for storing information, including instructions, that persists even when the computer system 1000 is turned off or otherwise loses power.

In many embodiments, information, including instructions, is provided to the bus 1010 for use by the processor from an external input device 1012, such as a keyboard containing alphanumeric keys operated by a human user, or a sensor. A sensor detects conditions in its vicinity and transforms those detections into signals compatible with the signals used to represent information in computer system 1000. Other external devices coupled to bus 1010, used primarily for interacting with humans, include a display device 1014, such as a cathode ray tube (CRT) or a liquid crystal display (LCD) or a plasma screen, for presenting images, and a pointing device 1016, such as a mouse or a trackball or cursor direction keys, for controlling a position of a small cursor image presented on the display 1014 and issuing commands associated with graphical elements presented on the display 1014.

In the illustrated embodiment, special purpose hardware, such as an application specific integrated circuit (IC) 1020, is coupled to bus 1010. The special purpose hardware is configured to perform operations not performed by processor 1002 quickly enough for special purposes. Examples of application specific ICs include graphics accelerator cards for generating images for display 1014, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 1000 also includes one or more instances of a communications interface 1070 coupled to bus 1010. Communication interface 1070 provides a two-way communication coupling to a variety of external devices that operate with their own processors, such as printers, scanners and external disks. In general, the coupling is with a network link 1078 that is connected to a local network 1080 to which a variety of external devices with their own processors are connected. For example, communication interface 1070 may be a parallel port or a serial port or a universal serial bus (USB) port on a personal computer. In some embodiments, communications interface 1070 is an integrated services digital network (ISDN) card or a digital subscriber line (DSL) card or a telephone modem that provides an information communication connection to a corresponding type of telephone line. In some embodiments, a communication interface 1070 is a cable modem that converts signals on bus 1010 into signals for a communication connection over a coaxial cable or into optical signals for a communication connection over a fiber optic cable. As another example, communications interface 1070 may be a local area network (LAN) card to provide a data communication connection to a compatible LAN, such as Ethernet. Wireless links may also be implemented. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, the communications interface 1070 sends and receives electrical, acoustic or electromagnetic signals, including infrared and optical signals that carry information streams, such as digital data.

The term computer-readable medium is used herein to refer to any medium that participates in providing information to processor 1002, including instructions for execution. Such a medium may take many forms, including, but not limited to, non-volatile media, volatile media and man-made signals on transmission media. Non-volatile media include, for example, optical or magnetic disks, such as storage device 1008. Volatile media include, for example, dynamic memory 1004. Transmission media include, for example, coaxial cables, copper wire, fiber optic cables, and waves that travel through space without wires or cables, such as acoustic waves and electromagnetic waves, including radio, optical and infrared waves. Computer-readable storage medium is used herein to refer to computer-readable media excluding signals on transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes or knobs, a RAM, a programmable ROM (PROM), an erasable PROM (EPROM), a FLASH-EPROM, or any other memory chip or cartridge, signals on a carrier wave, or any other medium from which a computer can read.

Network link 1078 typically provides information communication through one or more networks to other devices that use or process the information. For example, network link 1078 may provide a connection through local network 1080 to a host computer 1082 or to equipment 1084 operated by an Internet Service Provider (ISP). ISP equipment 1084 in turn provides data communication services through the public, world-wide packet-switching communication network of networks now commonly referred to as the Internet 1090. A computer called a server 1092 connected to the Internet provides a service in response to information received over the Internet. For example, server 1092 provides information representing video data for presentation at display 1014.

The invention is related to the use of computer system 1000 for implementing the techniques described herein. According to one embodiment of the invention, those techniques are performed by computer system 1000 in response to processor 1002 executing one or more sequences of one or more instructions contained in memory 1004. Such instructions, also called software and program code and logic, may be read into memory 1004 from another computer-readable medium such as storage device 1008. Execution of the sequences of instructions contained in memory 1004 causes processor 1002 to perform one or more of the method steps described herein. In alternative embodiments, hardware, such as application specific integrated circuit 1020, may be used in place of or in combination with software to implement the invention. Logic may be encoded in circuitry or other hardware to perform one or more steps of the invention. Thus, embodiments of the invention are not limited to any specific combination of hardware and software, unless otherwise stated.

The signals transmitted over network link 1078 and other networks through communications interface 1070, carry information to and from computer system 1000. Computer system 1000 can send and receive information, including program code, through the networks 1080, 1090 among others, through network link 1078 and communications interface 1070. In an example using the Internet 1090, a server 1092 transmits program code for a particular application, requested by a message sent from computer 1000, through Internet 1090, ISP equipment 1084, local network 1080 and communications interface 1070. The received code may be executed by processor 1002 as it is received, or may be stored in storage device 1008 or other non-volatile storage for later execution, or both. In this manner, computer system 1000 may obtain application program code in the form of a signal on transmission media such as a carrier wave.

Various forms of computer readable media may be involved in carrying one or more sequence of instructions or data or both to processor 1002 for execution. For example, instructions and data may initially be carried on a magnetic disk of a remote computer such as host 1082. The remote computer loads the instructions and data into its dynamic memory and sends the instructions and data over a telephone line using a modem. A modem local to the computer system 1000 receives the instructions and data on a telephone line and uses an infra-red transmitter to convert the instructions and data to a signal on an infra-red carrier wave serving as the network link 1078. An infrared detector serving as communications interface 1070 receives the instructions and data carried in the infrared signal and places information representing the instructions and data onto bus 1010. Bus 1010 carries the information to memory 1004 from which processor 1002 retrieves and executes the instructions using some of the data sent with the instructions. The instructions and data received in memory 1004 may optionally be stored on storage device 1008, either before or after execution by the processor 1002.

7. Extensions and Modifications

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for enhancing the spectral resolution of magnetic resonance spectroscopic (MRS) measurements of a subject comprising the steps of:
   receiving time domain echo data for an MRS volume in a subject from an MRS measurement;
   receiving high spatial resolution complex signal values within the MRS volume based on magnetic resonance imaging (MRI) measurements; and
   determining frequency-domain spectral content of the echo data of the MRS volume based at least in part on the complex signal values of the MRI measurements.

2. A method comprising:
   receiving time domain echo data for an MRS volume in a subject from an MRS measurement;
   receiving high spatial resolution complex signal values within the MRS volume based on magnetic resonance imaging (MRI) measurements, comprising receiving high spatial resolution complex signal values within the MRS volume for each of two different echo time settings; and
   determining the frequency-domain content of the echo data based at least in part on the complex signal values, comprising determining high resolution frequency dispersion values for the MRS volume based on differences in the complex signal values for the two different echo time settings.

3. The method as recited in claim 2, wherein the high resolution frequency dispersion values provide a magnetic field map data that indicates spatial variations in strength of a static magnetic field, $B_0$, in the MRS volume.

4. The method as recited in claim 2, wherein determining the frequency-domain content of the echo data further comprises:
   determining a time-domain lineshape profile for the MRS volume based on the high resolution frequency dispersion values;
   determining corrected echo data by de-convolving the lineshape profile and the echo data in the time domain; and
   determining frequency-domain content of the corrected echo data.

5. The method as recited in claim 4, wherein determining the corrected echo data further comprises applying a filtering window that reduces spikes generated when the lineshape profile falls below a noise level or approaches a value of zero.

6. The method as recited in claim 4, wherein determining the corrected echo data further comprises removing a water residue in the echo data before de-convolving the lineshape profile.

7. The method as recited in claim 4, wherein determining the lineshape profile further comprises matching the lineshape profile processing to the processing of the MSR measurement in the MRS volume to obtain the echo data.

8. The method as recited in claim 4, wherein determining the lineshape profile further comprises:
   synthesizing echo signals of the form $\exp(j\ 2\pi\Delta f(v_i)t_d)$, where exp( ) is a function that raises the natural constant e to the power of the value inside the parentheses, j is the square root of $-1$, i is an index for an individual MRI voxel in the MRS volume, $v_i$ is the position within the MRS volume of the ith MRI voxel, $t_d$ is a set of discrete sample times for the echo data, and $\Delta f(v_i)$ is a frequency dispersion value for an individual MRI voxel; and
   summing the synthesized echo signals for all MRI voxels in the MRS volume.

9. The method as recited in claim 8, wherein determining the lineshape profile further comprises:
   performing a two dimensional spatial inverse Fourier transform to transform the sum of synthesized echo signals into wavenumber space;
   cropping the wavenumber space data into a size of phase encoding dimensions used for the MRS volume;
   filtering the cropped wavenumber space data with a window function as done for the MRS measurement; and
   performing a Fourier transform on the filtered, cropped wavenumber space data back into the spatial domain, whereby the lineshape profile processing is matched to the processing of the MSR measurement in the MRS volume.

10. The method as recited in claim 8, wherein:
    determining the lineshape profile further comprises forming a multi-dimensional product by multiplying the synthesized echo with phase encoding functions in the form of
    $\exp(j\ 2\pi k_n * r)$, where $k_n$ is the wavenumber vector in wavenumber space and
    r is the position vector in real space;
    summing the synthesized echo for all MRI voxels in the MRS volume includes integrating the multi-dimensional product over the whole MRSI volume; and
    determining the lineshape profile further comprises repeating forming a multi-dimensional product and integrating the multidimensional product over the whole MRSI volume for all $k_n$ that are the same as in the MRS measurement.

11. The method as recited in claim 10, wherein determining the lineshape profile further comprises:
    filtering the multidimensional product with a window function as done for the MRS measurement; and
    performing a spatial Fourier transform on the multi-dimensional product in wavenumber space to produce a multi-dimensional product in real space and time.

12. A method for operating a magnetic resonance spectroscopic (MRS) system comprising the steps of:
    collecting time domain echo data for an MRS volume in a subject using an MRS mode of an MRS system;
    collecting high spatial resolution complex signal values within the MRS volume based on magnetic resonance imaging (MRI) measurements; and
    determining frequency-domain spectral content of the echo data of the MRS volume based at a least in part on the complex signal values of the MRI measurements.

13. A method for operating a magnetic resonance spectroscopic (MRS) system comprising:
    collecting time domain echo data for an MRS volume in a subject using an MRS mode of an MRS system;
    collecting high spatial resolution complex signal values within the MRS volume based on magnetic resonance imaging (MRI) measurements, further comprising collecting high spatial resolution complex signal values within the MRS volume for each of two different echo time settings; and determining frequency-domain content of the echo data based at a least in part on the complex signal values, further comprising determining high resolution frequency dispersion values for the MRS volume based on differences in the complex signal values for the two different echo time settings.

14. An apparatus for magnetic resonance spectroscopic (MRS) measurements comprising:

means for collecting time domain echo data for an MRS volume in a subject using an MRS mode of an MRS system;

means for collecting high spatial resolution complex signal values within the MRS volume based on magnetic resonance imaging (MRI) measurements; and means for determining frequency-domain spectral content of the echo data of the MRS volume based at least in part on the complex signal values of the MRI measurements.

15. An apparatus for magnetic resonance spectroscopic (MRS) measurements comprising:

means for collecting time domain echo data for an MRS volume in a subject using an MRS mode of an MRS system;

means for collecting high spatial resolution complex signal values within the MRS volume based on magnetic resonance imaging (MRI) measurements, further comprising means for collecting high spatial resolution complex signal values within the MRS volume for each of two different echo time settings; and means for determining the frequency-domain content of the echo data based at least in part on the complex signal values, further comprising means for determining high resolution frequency dispersion values for the MRS volume based on differences in the complex signal values for the two different echo time settings.

16. A non-transitory computer-readable storage medium carrying one or more sequences of instructions for enhancing the spectral resolution of magnetic resonance spectroscopic (MRS) measurements, wherein execution of the one or more sequences of instructions by one or more processors causes the one or more processors to perform the steps of:

receiving time domain echo data for an MRS volume in a subject from an MRS measurement;

receiving high spatial resolution complex signal values within the MRS volume based on magnetic resonance imaging (MRI) measurements; and determining frequency-domain spectral content of the echo data of the MRS volume based at least in part on the complex signal values of the MRI measurements.

17. A non-transitory computer-readable storage medium carrying one or more sequences of instructions for enhancing the spectral resolution of magnetic resonance spectroscopic (MRS) measurements, wherein execution of the one or more sequences of instructions by one or more processors causes the one or more processors to perform the steps of:

receiving time domain echo data for an MRS volume in a subject from an MRS measurement;

receiving the high spatial resolution complex signal values within the MRS volume based on magnetic resonance imaging (MRI) measurements, further comprising receiving high spatial resolution complex signal values within the MRS volume for each of two different echo time settings; and determining the frequency-domain content of the echo data based at least in part on the complex signal values, further comprising determining high resolution frequency dispersion values for the MRS volume based on differences in the complex signal values for the two different echo time settings.

* * * * *